(12) United States Patent
Paz et al.

(10) Patent No.: US 7,383,140 B2
(45) Date of Patent: Jun. 3, 2008

(54) CAPACITANCE, INDUCTANCE AND IMPEDANCE MEASUREMENTS USING MULTI-TONE STIMULATION AND DSP ALGORITHMS

(75) Inventors: Gustavo Jesus Castro Paz, Austin, TX (US); George C. Topala, Austin, TX (US)

(73) Assignee: National Instruments Corporation, Austin, TX (US)

( * ) Notice: Subject to any disclaimer, the term of this patent is extended or adjusted under 35 U.S.C. 154(b) by 52 days.

(21) Appl. No.: 11/049,028

(22) Filed: Feb. 2, 2005

(65) Prior Publication Data

US 2006/0036382 A1 Feb. 16, 2006

Related U.S. Application Data

(60) Provisional application No. 60/601,879, filed on Aug. 16, 2004.

(51) Int. Cl.
*G01R 25/00* (2006.01)
(52) U.S. Cl. .................................................. 702/65
(58) Field of Classification Search ................ 702/65
See application file for complete search history.

(56) References Cited

U.S. PATENT DOCUMENTS

| 6,721,673 | B2 | 4/2004 | Rao |
| 6,775,629 | B2 | 8/2004 | Rao et al. |
| 6,965,068 | B2 | 11/2005 | Moriat |
| 6,970,738 | B1* | 11/2005 | Othman et al. ............ 600/547 |
| 2003/0206021 | A1* | 11/2003 | Laletin et al. .............. 324/426 |

OTHER PUBLICATIONS

"Agilent Technologies Impedance Measurement Handbook," Dec. 2003, Agilent Technologies, pp. 1-1 to 1-2 and 5-37.*
"Dissipation factor," Academic Press Dictionary of Science and Technology, 1996.*
"Q," Hargrave's Communication Dictionary, Wiley, 2001.*
"Model 4274A Multi-Frequency LCR Meter"; Hewlett-Packard; Sep. 1980.
Greg Amorese; "LCR/Impedance Measurement Basics"; 1997 Back to Basics Seminar; 1997; 81 pages; Hewlett-Packard Company.
Richard P. Bingham; "Harmonics—Understanding the Facts"; Feb. 6, 2001; 11 pages; Dranetz Technologies, Inc.
"3321/3322/3300 LCZ Meter Calibration packing list"; Jan. 2003; 17 pages; Keithley Instruments, Inc.
Kazunari Okada and Toshimasa Sekino; "Impedance Measurement Handbook"; Dec. 2003; 128 pages; Agilent Technologies Co. Ltd.

* cited by examiner

*Primary Examiner*—John E. Barlow, Jr.
*Assistant Examiner*—Lisa C. Sievers
(74) *Attorney, Agent, or Firm*—Meyertons Hood Kivlin Kowert & Goetzel, P.C.; Jeffrey C. Hood; Martin R. Wojcik

(57) ABSTRACT

A method for measuring the value of an electronic component, including applying a voltage or a current signal to the electronic component, where the signal has a first tone and a second tone of a different frequency, measuring a response signal from the electronic component, where the response signal also has a first tone and a second tone, applying signal processing on the measured response signal to generate a frequency domain signal, and calculating the value of the electronic component by using a relationship between the first tone of the response signal and the second tone of the response signal.

58 Claims, 12 Drawing Sheets

| Frequency | Decimation rate | Acquisition size | Voltage range |
|---|---|---|---|
| 91Hz | 950 Samples/point | 512 waveform points | 1V |
| 1kHz | 110 Samples/point | 512 waveform points | 1V |
| 10kHz | 12 Samples/point | 2048 waveform points | 1V |

|  | OPEN Compensation | SHORT Compensation |
|---|---|---|
| Parallel capacitance | $B_X = B_{XM} - B_{OM}$<br>$G_X = G_{XM} - G_{OM}$ | $B_X = B_{XM}$<br>$G_X = G_{XM}$ |
| Series capacitance | $X_X = X_{XM}$<br>$R_X = R_{XM}$ | $X_X = X_{XM} - X_{SM}$<br>$R_X = R_{XM} - R_{SM}$ |

*Fig. 11A*

| Parallel inductance | $B_X = B_{XM} - B_{OM}$<br>$G_X = G_{XM} - G_{OM}$ | $B_X = B_{XM}$<br>$G_X = G_{XM}$ |
|---|---|---|
| Series inductance | $X_X = X_{XM}$<br>$R_X = R_{XM}$ | $X_X = X_{XM} - X_{SM}$<br>$R_X = R_{XM} - R_{SM}$ |

*Fig. 11B*

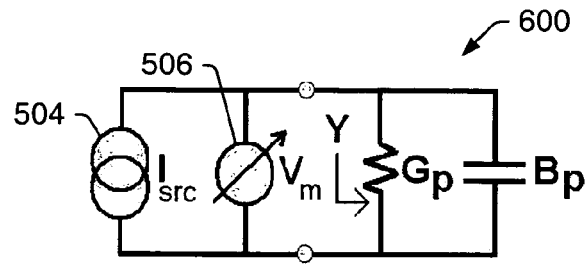
Fig. 14A
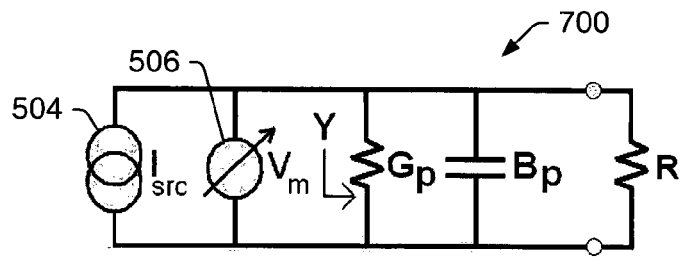
Fig. 14B
| f | Is | Acquisition size | Decimation rate | Average | R1 | R2 | Voltage range |
|---|---|---|---|---|---|---|---|
| 91Hz | 500nA | 512 | 950 | 20rdgs | 5kOhm | 100kOhm | 10V |
| 1kHz | 500nA | 512 | 110 | 20rdgs | 5kOhm | 100kOhm | 1V |
| 10kHz | 500nA | 2048 | 12 | 20rdgs | 5kOhm | 100kOhm | 1V |
Fig. 15

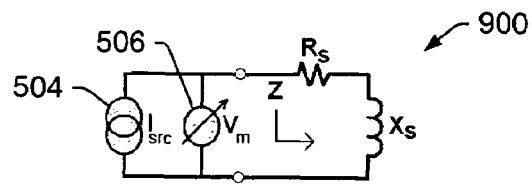
*Fig. 17A*
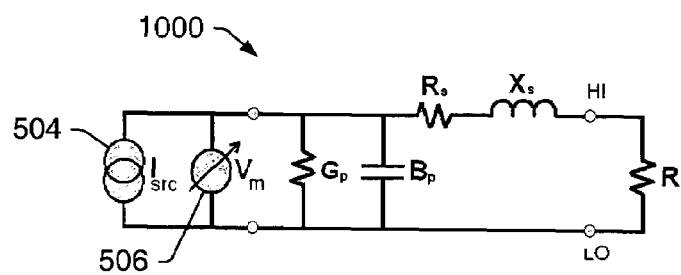
*Fig. 17B*
| f | Is | Acquisition size | Decimation rate | Average | R | Voltage range |
|---|---|---|---|---|---|---|
| 91Hz | 1mA | 512 | 950 | 3 | 25Ohm | 1V |
| 1kHz | 1mA | 512 | 110 | 20 | 25Ohm | 1V |
| 10kHz | 1mA | 2048 | 12 | 40 | 25Ohm | 1V |
*Fig. 18*

CAPACITANCE, INDUCTANCE AND IMPEDANCE MEASUREMENTS USING MULTI-TONE STIMULATION AND DSP ALGORITHMS

PRIORITY CLAIM

This application claims benefit of priority of U.S. provisional application Ser. No. 60/601,879 titled "Capacitance, Inductance and Impedance Measurements Using Multi-Tone Simulation and DSP Algorithms" filed Aug. 16, 2004, whose inventors were Gustavo Jesus Castro Paz and George C. Topala.

FIELD OF THE INVENTION

The present invention relates to the field of instrumentation, and more particularly to a system and method for enabling a measurement system to measure the value of a capacitor or an inductor using digital processing techniques.

DESCRIPTION OF THE RELATED ART

There are many measurement methods for measuring impedance, most of them using analog techniques. FIGS. 1A-1G summarize many of the existing techniques for measuring the value of an electronic component, such as a capacitor or an inductor.

FIG. 1A—Bridge Method (Prior Art)

FIG. 1A illustrates a bridge measuring method according to the prior art. When no current flows through the detector (D), the value of the unknown impedance Zx can be obtained by the relationship of the other bridge elements. Various types of bridge circuits, employing combinations of L, C, and R components as the bridge elements, can be used for various applications.

FIG. 1B—Resonant Method (Prior Art)

FIG. 1B illustrates a resonant measuring method according to the prior art. When a circuit is adjusted to resonance by adjusting a tuning capacitor C, the unknown impedance Lx and Rx values are obtained from the test frequency, C value, and Q value. Q is measured directly using a voltmeter placed across the tuning capacitor. Because the loss of the measurement circuit is very low, Q values as high as 1000 can be measured. Other than the direct connection shown in FIG. 1B, series and parallel connections are available for a wide range of impedance measurements.

FIG. 1C—I-V Method (Prior Art)

FIG. 1C illustrates an I-V measuring method according to the prior art. An unknown impedance Zx can be calculated from measured voltage and current values. Current can be calculated using the voltage measurement across an accurately known low value resistor R. A low/loss transformer can be used in place of R to prevent the effects caused by placing a low value resistor in the circuit. The transformer may limit the low end of the applicable frequency range.

FIGS. 1D and 1E—RF I-V Measurement (Prior Art)

FIGS. 1D and 1E illustrate an RF I-V measurement method according to the prior art. While the RF I-V measurement method is based on the same principle as the I-V method, it is configured in a different way by using an impedance matched measurement circuit (50 Ω) and a precision coaxial test port for operation at higher frequencies. There are two types of the voltmeter and current meter arrangements, which are suited to low impedance and high impedance measurements. Impedance of the device under test (DUT) is derived from measured voltage and current values, as illustrated. The current that flows through the DUT is calculated from the voltage measurement across a known low value resistor R. A low loss transformer may be used in place of the low value resistor R. The transformer may limit the low end of the applicable frequency range.

FIG. 1F—Network Analysis Method (Prior Art)

FIG. 1F illustrates a network analysis measuring method according to the prior art. The reflection coefficient is obtained by measuring the ratio of an incident signal to the reflected signal. A directional coupler or bridge is used to detect the reflected signal and a network analyzer is used to supply and measure the signals. Since this method measures reflection at the DUT, it is usable in the higher frequency range.

FIG. 1G—Auto Balancing Method (Prior Art)

FIG. 1G illustrates an auto balancing measuring method according to the prior art. The current, flowing through the DUT, also flows through resistor R. The potential at the "L" point is maintained at zero volts (thus called a "virtual ground"), because the current through R balances with the DUT current by operation of the IV converter amplifier. The DUT impedance is calculated using a voltage measurement at the high terminal H and across the resistor R.

It would be beneficial to measure the value of an electronic component by measuring only magnitude of voltage and current across a two-terminal component. It would also be beneficial to use a measurement in the frequency domain in order to simplify the measurement complexity.

SUMMARY OF THE INVENTION

One embodiment of the present invention comprises a system and method for measuring the value of an electronic component by measuring only magnitudes of the signals across it. The phase of both the voltage and current may be unknown in applications where the acquisition is not triggered.

In one embodiment, a voltage or a current signal is applied across the electronic component to be measured. This signal may have first and second tones of different frequencies. A response signal may be measured from the electronic component, where the response signal also has a first tone and a second tone. Next, signal processing may be applied on the measured response signal to generate a frequency domain signal. In one embodiment, the frequency domain signal may only contain magnitude information at each frequency of the measured response signal. The value of the electronic component may be calculated from the frequency domain signal using a relationship between the first tone of the response signal and the second tone of the response signal.

The voltage or current signal that is applied across the electronic component, i.e., the source signal, preferably does not change under different loads. Furthermore, the voltage or current signal may be calibrated prior to the measurement of the electronic component. A constant current signal may be applied to the electronic component, and voltage across the electronic component may be measured. Alternatively, a voltage signal may be applied to the electronic component, resulting in a current being measured across the electronic component.

In order to calculate the value of an electronic component without measuring the phase information of the measured signal, two source signals of different frequencies with a known relative phase angle between them can be used. One example is a source signal that contains two frequencies or tones. Since the two tones or frequencies do not necessarily have to be the same magnitude, a square wave may be used, as it is easy to generate. The square wave may contain two tones that can be extracted using an FFT algorithm: the fundamental and the third harmonic. These two tones usually have the highest magnitudes. Alternatively, other tones may be extracted. Other source signals may also be used, such as other periodic signals, two single tone signals or a two-tone signal, beside others.

For the square wave example, the fundamental and third harmonics for the source signal may be known from the calibration. By measuring voltage across the electronic circuit the voltages are known as well. Next, impedance and/or admittance magnitudes may be calculated:

$$Z_1 = \frac{V_1}{I_1}$$

$$Z_3 = \frac{V_3}{I_3}$$

$$Y_1 = \frac{I_1}{V_1},$$

$$Y_3 = \frac{I_3}{V_3}$$

The impedance, or admittance, should change only its imaginary component when the frequency changes. This means that the different tones of the same signal may see different impedances across the same reactive element. Since phase information is not known for these signals, the real component may be assumed to be the same for the two frequencies, and the following equations can be used:

$$Z_1^2 = R^2 + X_1^2$$

$$Z_3^2 = R^2 + X_3^2$$

It is also known that $X_1 = 3(X_3)$. Given these 3 equations, where $Z_1$ and $Z_3$ are known values, values for R, $X_1$ and $X_3$ can be calculated. Since the frequency is also a known value, the capacitance or inductance value of the electronic component can be calculated using relationships between these values.

BRIEF DESCRIPTION OF THE DRAWINGS

A better understanding of the present invention can be obtained when the following detailed description of the preferred embodiment is considered in conjunction with the following drawings, in which:

FIGS. 11A and 11B are tables illustrating calculations used to obtain values of impedance and/or admittance used for compensation calculations, according to one embodiment;

FIG. 14A is a model used in performing an open circuit measurement, according to one embodiment;

FIG. 14B is a model used in performing a resistance measurement for input admittance calibration, according to one embodiment;

FIG. 15 is a table illustrating an exemplary set of signals and resistors as used by an exemplary method for performing an input admittance calibration, according to one embodiment;

FIG. 17A is a model used in performing a short circuit measurement, according to one embodiment;

FIG. 17B is a model used in performing a resistance measurement for a series impedance calibration, according to one embodiment; and FIG. 18 is a table illustrating an exemplary set of signals and resistors as used by an exemplary method for performing a series impedance calibration, according to one embodiment.

Figure 1A:
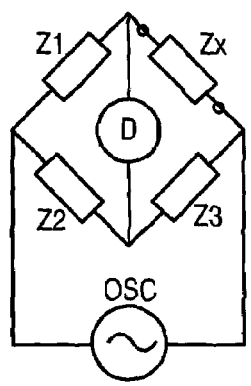
FIGS. 1A-1G illustrate existing methods to measure impedance, according to prior art.
Figure 1B:
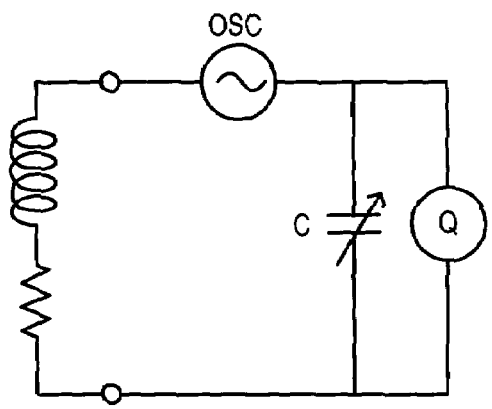
Figure 1C:
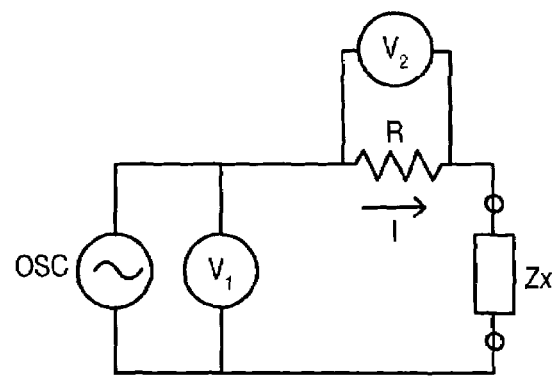
Figure 1E:
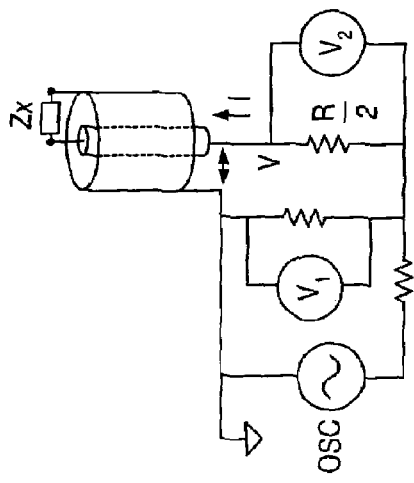
Figure 1G:
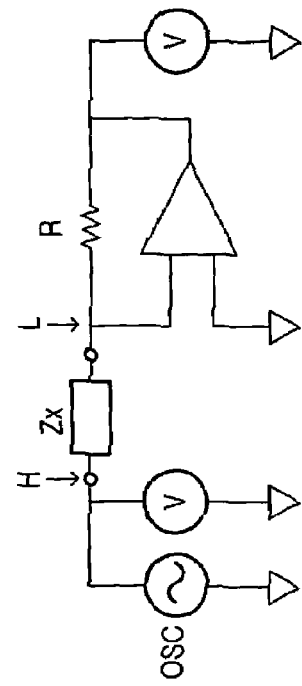
Figure 1D:
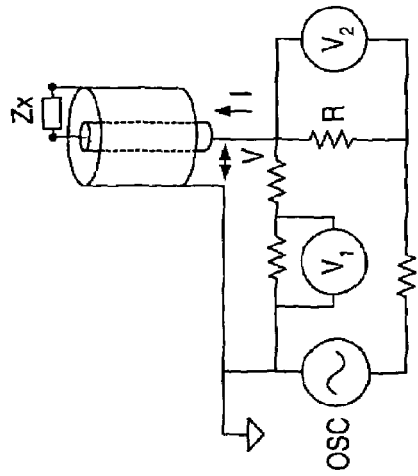
Figure 1F:
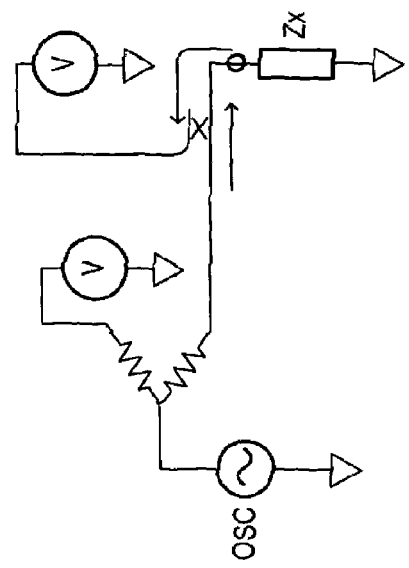

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIGS. 2A-2D

Figure 2A:
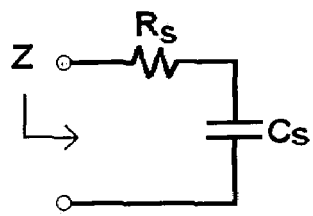
FIG. 2A illustrates an equivalent model of impedance as a series resistor-capacitor circuit, according to one embodiment.
Figure 2C:
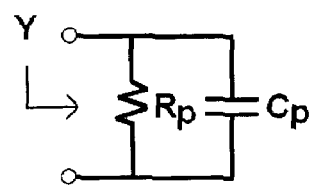
FIG. 2C illustrates an equivalent model of admittance as a parallel resistor-capacitor circuit, according to one embodiment.
Figure 2B:
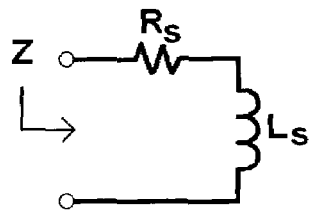
FIG. 2B illustrates an equivalent model of impedance as a series resistor-inductor circuit, according to one embodiment.
Figure 2D:
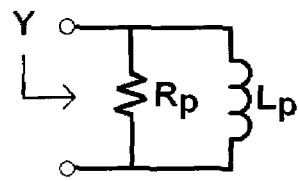
FIG. 2D illustrates an equivalent model of admittance as a parallel resistor-inductor circuit, according to one embodiment.

FIGS. 2A and 2B illustrate equivalent models of impedance that may be applied to model electronic circuits. FIGS. 2C and 2D illustrate equivalent models of admittance that may be applied to model electronic circuits. FIG. 2A illustrates an equivalent model of impedance as a series resistor-capacitor circuit, according to one embodiment. FIG. 2B illustrates an equivalent model of impedance as a series resistor-inductor circuit, according to one embodiment. FIG. 2C illustrates an equivalent model of admittance as a parallel resistor-capacitor circuit, according to one embodiment. FIG. 2D illustrates an equivalent model of admittance as a parallel resistor-inductor circuit, according to one embodiment.

For an AC signal across a two-terminal component with a known magnitude and phase of the voltage and current flowing through it, the value of the component may be calculated. The impedance is defined as the total opposition to the flow of alternating currents. The impedance is represented as a complex number that results from the division of the voltage over the current across the circuit element of interest:

$$Z = \frac{V}{I}$$

As a complex number, the impedance can be represented in a vector form. When the impedance vector is expressed in its polar form, it provides the magnitude and phase angle, where this angle is the phase difference between the voltage and current:

$$Z = Z < \theta$$

When the impedance vector is expressed in its rectangular form, $$Z = R_S + jX_S$$

The real and imaginary parts are called resistance (R) and reactance (X) respectively. This representation allows modeling of the impedance as an equivalent of a resistive component (e.g., a resistor) and a reactive component (such as a capacitor or an inductor), such as shown in FIGS. 2A-2B.

$$X_S = \frac{1}{\omega C_S}$$

$$X_S = \omega L_S$$

Sometimes, to simplify calculations and analysis, the quantity called admittance may be used instead of the impedance and it is defined as:

$$Y = \frac{I}{V}$$

When the admittance is written in its rectangular representation, the real and imaginary components are called conductivity (G) and susceptance (B), the admittance may be represented as:

$$Y = G_P + jB_P$$

where G and B represent the quantities on the following models:

$$G_P = \frac{1}{R_P}$$

$$B_P = \omega C_P$$

$$B_P = \frac{1}{\omega L_P}$$

Figure 3A:
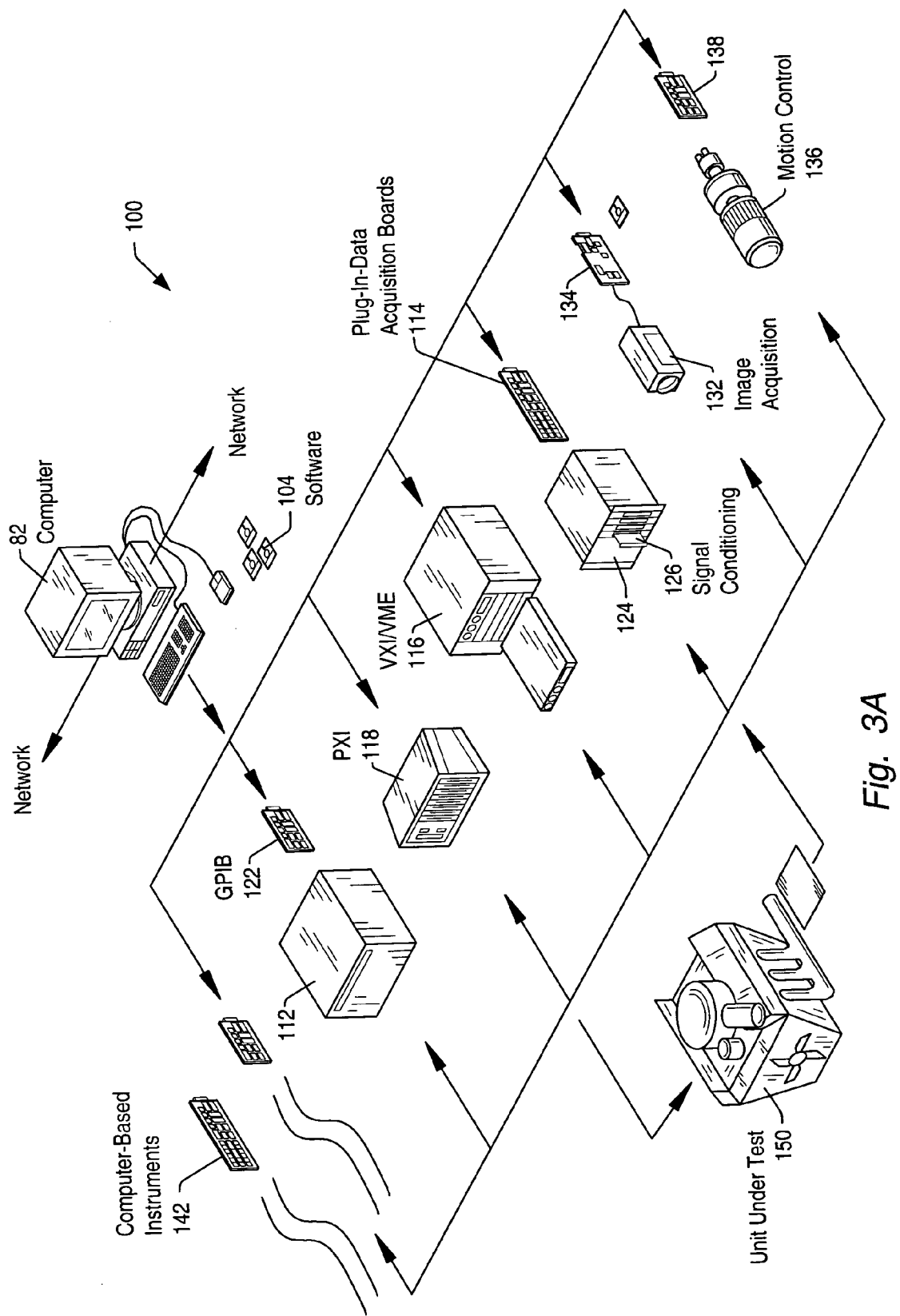
FIG. 3A illustrates an exemplary instrumentation control system, according to one embodiment.

FIG. 3A—Instrumentation Control System

FIG. 3A illustrates an exemplary instrumentation control system 100 which may implement embodiments of the invention. The system 100 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others. The one or more instruments may include a measuring device and/or a signal generator device operable to measure an electronic component, such as described below with reference to FIG. 8.

Figure 3B:
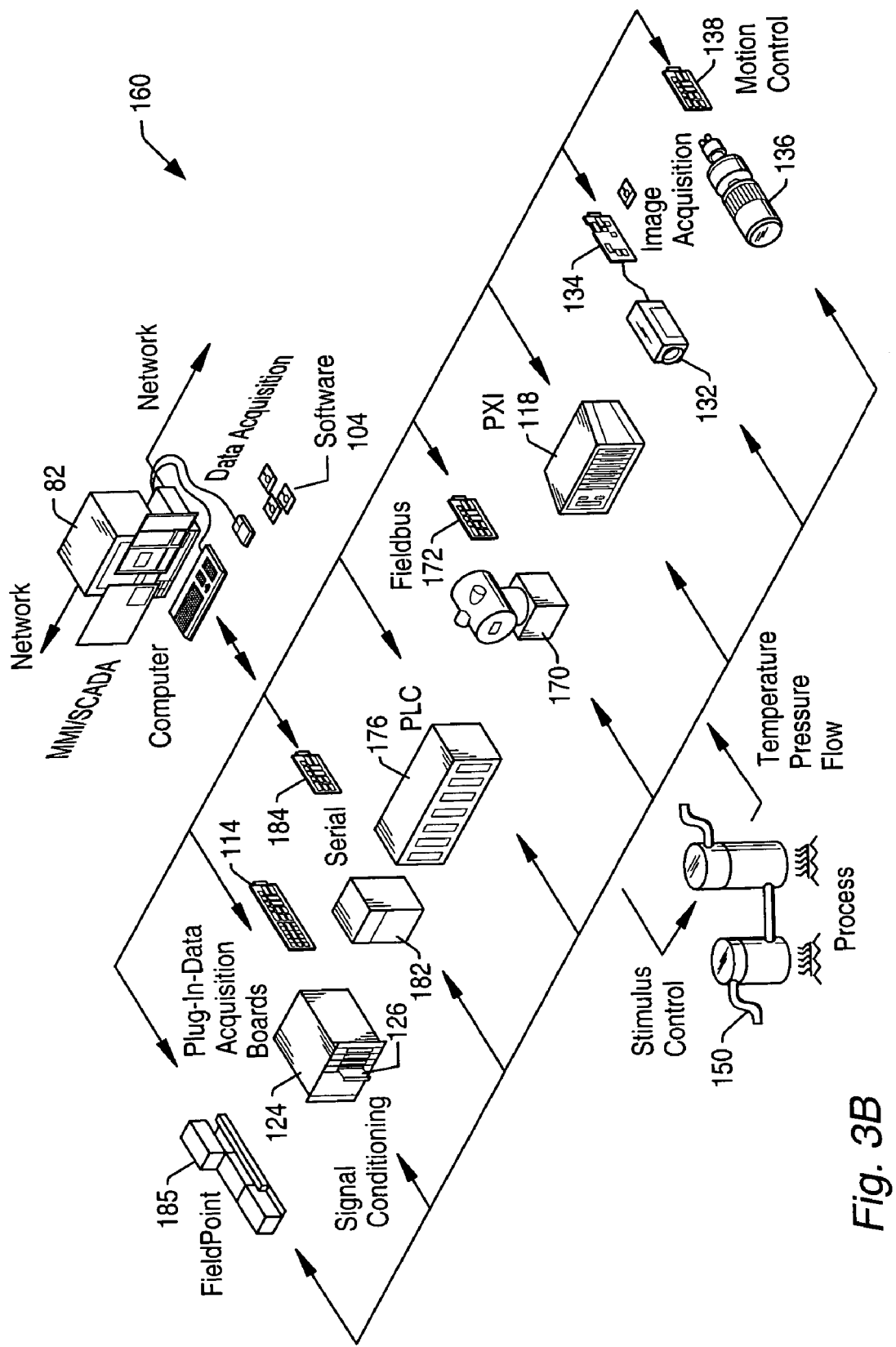
FIG. 3B illustrates an exemplary industrial automation system, according to one embodiment.

FIG. 3B—Industrial Automation System

FIG. 3B illustrates an exemplary industrial automation system 160 which may implement embodiments of the invention. The industrial automation system 160 is similar to the instrumentation or test and measurement system 100 shown in FIG. 3A. Elements which are similar or identical to elements in FIG. 3A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to measure and/or control a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the FieldPoint system available from National Instruments, among other types of devices. The one or more devices may include a measuring device and/or a signal generator device operable to measure an electronic component, such as described below with reference to FIG. 8.

Figure 4:
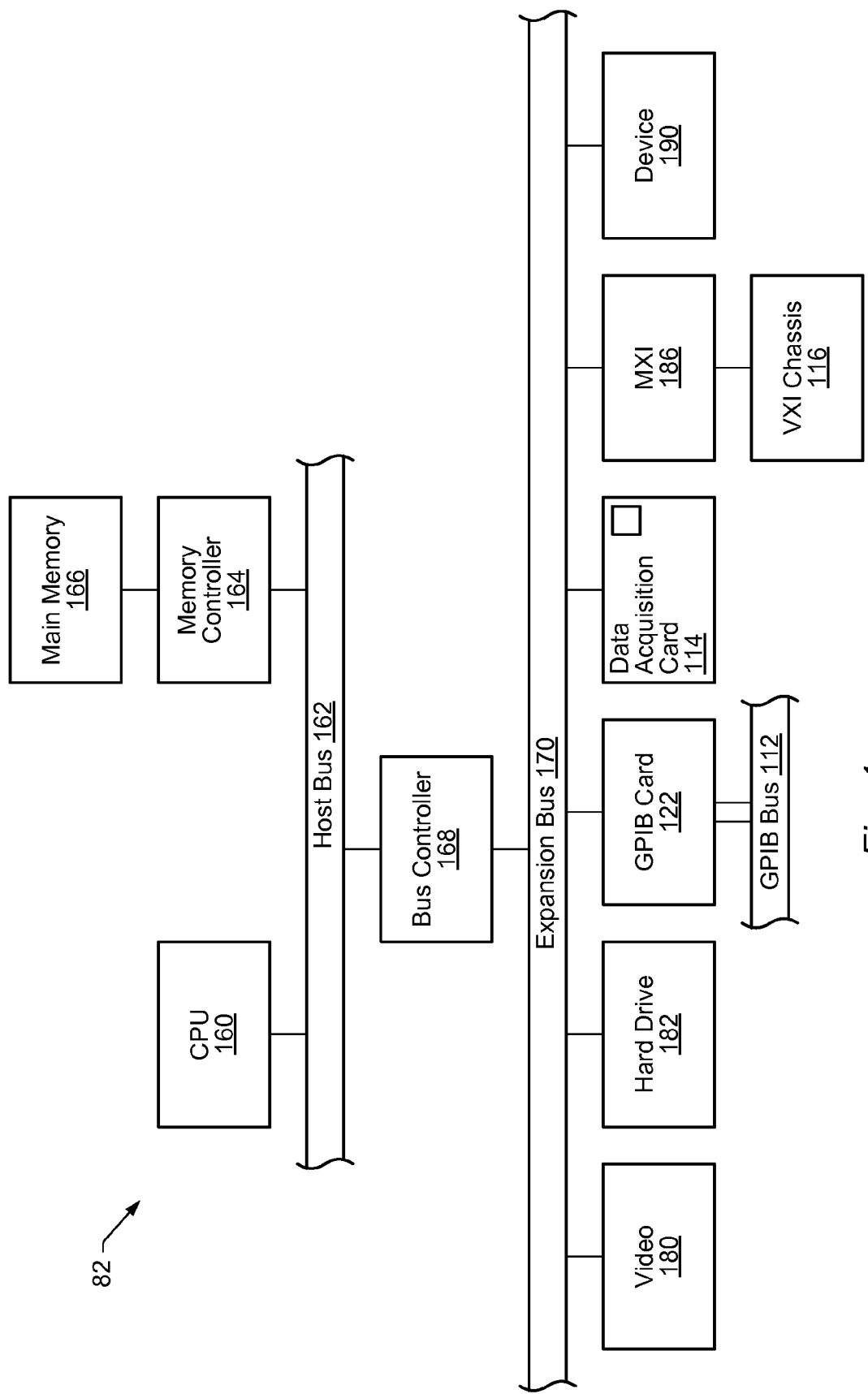
FIG. 4 is a block diagram of an exemplary computer system block diagram, according to one embodiment.

FIG. 4—Computer System Block Diagram

FIG. 4 is a block diagram representing one embodiment of the computer system 82 shown in FIGS. 3A or 3B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store a software program operable to measure an electronic component, such as a capacitor or an inductor, according to the method described below. The main memory may also store operating system software, as well as other software for operation of the computer system. Alternatively the method for measuring the electronic component may be implemented in an FPGA and/or any of the devices mentioned below.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element. The computer system may be operable to deploy a software program, such as a graphical program, to the device 190 for execution of the software program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program. The deployed software program, such as the graphical program, may be operable to measure an electronic component such as a capacitor or an inductor, according to the method described below.

Figure 7:
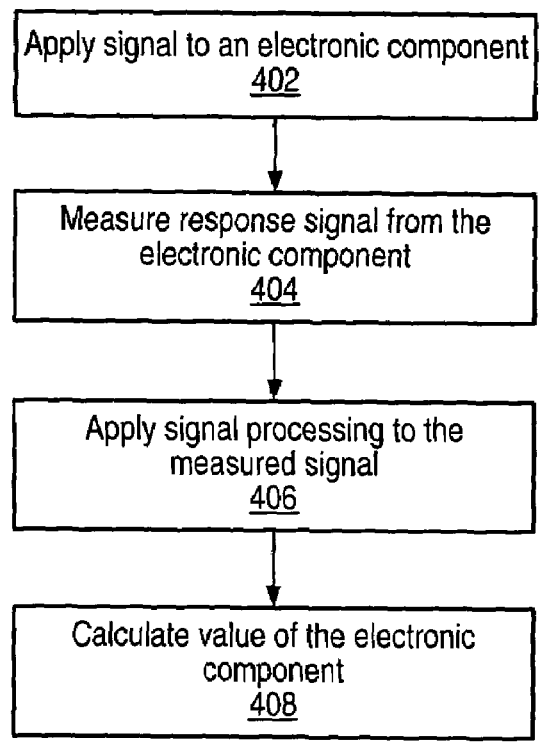
FIG. 7 is an exemplary flowchart of a method to measure a value of an electronic component, according to one embodiment.

FIG. 7—Method for Measuring an Electronic Component

FIG. 7 is an exemplary flowchart of a method to measure an electronic component, according to one embodiment. In some embodiments, a measuring device may perform the measurement. In some embodiments, the measuring device may be calibrated prior to measuring the electronic component. The calibration is described below with reference to FIGS. 12-18. In some embodiments, the measuring device may be compensated prior to performing the measurements, such as described below with reference to FIGS. 10-11. In some embodiments, the measuring device may be DC offset using a DC bias technique prior to performing the measurements, such as described below.

In 402, a signal can be applied to an electronic component, such as an electronic component 502 described below with reference to FIG. 8. In one embodiment, the applied signal comprises a current or voltage signal. For example, the applied signal can be generated by a measuring device that may comprise a signal generator, such as described below. In one embodiment, the applied signal can be generated by a simple digital output, such as a digital input/output (DIO) device. In one embodiment, the applied signal may be generated without phase information, meaning the phase of the generated signal may not be known at all times.

In one embodiment, the generated signal comprises a first tone and a second tone. In one embodiment, the generated signal may be a signal that comprises two or more tones, such as a first tone and a second tone. The frequency of the first tone may be different from the frequency of the second tone. In one embodiment, the generated signal is a periodic signal that comprises two or more fundamental frequencies. For example, in one embodiment the periodic signal may be a square wave that is generated by a DIO device. In other embodiments the periodic signal may be a triangle wave signal, a sinusoidal wave signal, or any other periodic signal that comprises two or more frequencies.

In 404, a response signal may be measured from the electronic component. In one embodiment, the response signal comprises one of a current and a voltage generated across the electronic component in response to applying the signal. The response signal may be of a different type from the applied signal, i.e., if a voltage signal was applied then a current is measured, and vice versa. A measuring device can measure the response signal, such as described below.

Figure 6:
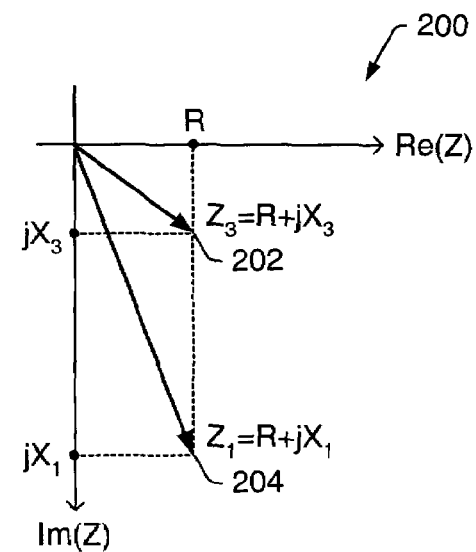
FIG. 6 illustrates a graph in phasor notation of two exemplary frequencies, according to one embodiment.

In some embodiments, the response signal may comprise a first tone and a second tone. The response signal may have phase and magnitude information. For example, the first tone and the second tone of the measured response signal may each comprise a measured magnitude and a phase angle of the measured impedance as noted in phasor quantity in a complex number plane, such as illustrated in FIG. 6. However, in some embodiments measuring the response signal only measures the magnitude of the response signal. In other words, the phase may not be measured, or needed, to perform the necessary calculations for the value of the electronic component.

In 406, signal processing may be applied to the measured signal in order to generate information in the frequency domain, i.e., generate a frequency domain signal that describes the measured signal. In one embodiment, during signal processing only magnitude information associated with the measured response signal is used. In some embodiments, the signal processing techniques used on the measured signal comprise one or more of:

Tone extraction;
Peak detection;
Fast Fourier Transform;
Discrete Fourier Transform;
Power Spectrum Analysis; and
any other type of a signal processing technique that operates to extract magnitudes of interest of a signal.

In some embodiments, a signal-processing device may perform the signal processing. In some embodiments, signal processing may be implemented in a software program, such as described above. In some embodiments, a dedicated entity may perform the signal processing, such as a separate computing device.

Figure 5A:
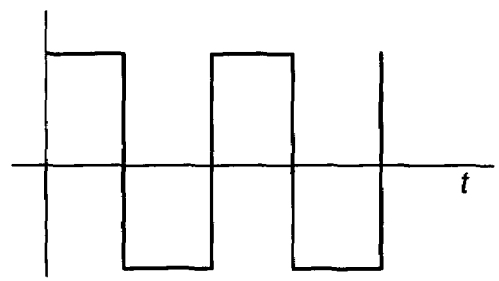
FIG. 5A illustrates an exemplary periodic signal in time domain, according to one embodiment.
Figure 5B:
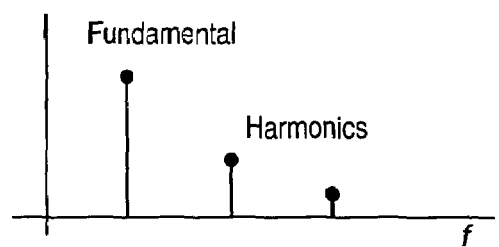
FIG. 5B illustrates an exemplary periodic signal in frequency domain, according to one embodiment.

In some embodiments, if a periodic signal was applied to the electronic component, then signal processing that was used on the measured signal may generate a frequency domain signal that corresponds to a first fundamental frequency of the response signal. In some embodiments, the first fundamental frequency may be a first odd harmonic of the response signal, such as a first harmonic. In some embodiments, signal processing that was used on the measured signal may generate a frequency domain signal that corresponds to a second fundamental frequency of the response signal. In some embodiments, the second fundamental frequency may be a second odd harmonic of the response signal, such as a third harmonic, such as illustrated in FIGS. 5A and 5B.

The signal processing extracts tone amplitudes on the frequency domain, for which an FFT is used. In some embodiments, before the FFT operation may be performed on the acquired waveform, data may be pre-processed by a time-domain window, such as a Hanning window, to avoid spectral leakage and to improve accuracy in the tone amplitude extraction.

In some embodiments, the windowed data array may be processed by the FFT algorithm to obtain an array of complex numbers in the frequency domain, from which the amplitude spectrum can be obtained by computing the square-root of the sum of the squares of each complex number. Next, in some embodiments where a periodic signal is used, the amplitude spectrum may analyze the resulting array in order to find the fundamental and third harmonic amplitudes and frequencies.

In some embodiments, the Fourier Transform may be used to extract tone information from the signal. The Fourier Transform is a complex and continuous representation of a signal in the frequency domain. However, in order to obtain the Fourier Transform, a continuous response signal in the time domain may be needed, which may not be possible with a discrete acquisition system. In some embodiments, a Discrete Fourier Transform (DFT) can be used instead. The DFT is a numerical method that takes a time-discrete signal as an input (usually as an array of numbers) and returns the signal contents in the frequency domain (usually as an array of complex numbers of half the size as the input).

Since the input signal is time-discrete, the output may not be a continuous function, but an array of numbers that holds the signal contents on equally divided frequency intervals. These intervals are called "bins". The bin size (bin width of DFT resolution) may be determined by the sampling period. For example, the faster the sampling, the narrower the bin.

Due to the complexity of the DFT algorithm, it may take a long time to compute. In some embodiments, a variation of the algorithm may be used, called the Fast Fourier Transform (FFT). The FFT may work for input arrays whose size is a power of 2 and thus can be computed quickly. In some embodiments, the DFT (or FFT) can provide magnitude and phase information using an array of complex numbers. Each bin may contain that information. However, the absolute phase of each bin may be relative to the phase between the waveform and the acquisition. This also means that it is possible to know the relative phase between the different bins, even if the acquisition phase is unknown.

For non-triggered acquisitions (e.g. the acquisition could start at any random place in the waveform), the phase information may not provide much information since it could be any random number depending on where the acquisition started. On the other hand, the magnitude information may be the same, regardless of the phase. For a particular bin from the waveform transform, the real and imaginary components could be almost any pair of numbers whose squares sum may compute the same result. In other words, the complex vector may have the same magnitude with a random phase angle.

The sum of the squares of the complex FFT is the equivalent to the product of the complex conjugates:

$$(FFT(x))(FFT^*(x)) = \text{Power\_spectrum}(x) = S(x)$$

This is known as either the power spectral density or power spectrum. Each bin of the power spectrum contains the power dissipated in that frequency range across a 1-Ohm resistor. Adding all the bins contents may yield the total power in the signal. The square root of the power spectrum provides the amplitude spectrum. From the amplitude spectrum the amplitude of a tone can be extracted. The amplitude of the tone indicates the quantity of the time-domain waveform, e.g., voltage or current.

When extracting single tone information, the desired frequency may be bundled with an infinite number of adjacent frequencies on the same bin. One method of approximating may be to interpolate the value on the frequency of interest with the adjacent bins. This process enables the extraction of a particular tone of interest out of a multitone signal, such as a periodic non-sinusoidal waveform.

To summarize, in 406, the measured signal from 404 may be processed using signal processing techniques in order to generate a frequency domain signal. The frequency domain signal contains information on one or more frequencies contained in the measured signal as well as their magnitude. In some embodiments, during signal processing, only magnitude information associated with the measured response signal is used, and as a result, only magnitude information is associated with the corresponding components of the frequency domain signal.

In 408, the value of the electronic component may be calculated using the frequency domain signal generated in 406. In some embodiments, calculating the value of the electronic component uses a relationship between the first tone of the response signal and the second tone of the response signal, i.e., by using the frequency domain signal. In some embodiments, calculating the value of the electronic component only uses magnitude information associated with the measured response signal.

In some embodiments, a calculation device may perform the signal processing. In some embodiments, the calculation may be implemented in a software program, such as described above. In some embodiments, a dedicated entity may perform the calculation, such as a separate computing device.

For example, by measuring voltage across the electronic circuit the voltages are known. The parameters of the source signal may be known from the calibration phase. Next, impedance and/or admittance magnitudes may be calculated:

$$Z_1 = \frac{V_1}{I_1}$$

$$Z_3 = \frac{V_3}{I_3}$$

$$Y_1 = \frac{I_1}{V_1},$$

$$Y_3 = \frac{I_3}{V_3}$$

The impedance, or admittance, may change its imaginary component only when the frequency changes. As a result, different tones of the same signal may see different impedances across the same reactive element. Since phase information is not known for these signals, the real component may be assumed to be the same for the two frequencies, and the following equations can be used:

$$Z_1^2 = R^2 + X_1^2$$

$$Z_3^2 = R^2 + X_3^2$$

In addition, it may be assumed that $X_1 = 3(X_3)$. Given these 3 equations, where $Z_1$ and $Z_3$ are known values, values for R, $X_1$ and $X_3$ can be calculated. The $Z_1$ and $Z_3$ values are the magnitudes of the impedance of the electronic component at the first tone and at the second tone of the measured response signal respectively. Since the frequency is also a known value, the capacitance or inductance value can be calculated using relationships between these values.

In some embodiments, depending on the relationships between the magnitudes of the signals at different tones, either a capacitive or an inductive value will be measured. For example, in some embodiments an electronic component with capacitive properties may be chosen when the magnitude of the impedance at the first frequency is greater than the magnitude of the impedance at the second frequency. Similarly, an electronic component with inductive properties may be chosen when the magnitude of the impedance at the first frequency is smaller than the magnitude of the impedance at the second frequency In some embodiments, the value of the electronic component with capacitive properties may be equal to $$\frac{1}{X\omega},$$

where $\omega$ is equal to $2\pi f_0$, wherein $f_0$ is substantially equal to the frequency of the measured signal and where X may be calculated from the frequency domain signal. In other words, X may be calculated from the relationships of multiple impedance magnitudes at different frequencies. In some embodiments, calculating X from measurement of multiple impedance magnitudes at different frequencies may calculate X being substantially equal to $\sqrt{K}$. In some embodiments, K may be calculated from the relationship between the magnitude of the measured impedance at the first frequency and the magnitude of the measured impedance at the second frequency.

In some embodiments where a periodic signal is used, such as a square wave, where the first tone includes a first frequency and the second tone includes a second frequency, X may be calculated from $$\sqrt{\frac{9}{8}(Z_1^2 - Z_3^2)}.$$

$Z_1$ is equal to the magnitude of the measured impedance at the first fundamental frequency and $Z_3$ is substantially equal to the magnitude of the measured impedance at the second fundamental frequency.

In some embodiments, the value of the electronic component with inductive properties may be equal to $$\frac{X}{\omega},$$

where $\omega$ is equal to $2\pi f_0$ and where $f_0$ is substantially equal to the frequency of the measured signal. In some embodiments, X may be calculated from measurement of multiple impedance magnitudes at different frequencies. In some embodiments, X may be calculated from $\sqrt{K}$, where K is calculated from the relationship between the magnitude of the measured impedance at the first frequency and the magnitude of the measured impedance at the second frequency.

In some embodiments where a periodic signal is used, such as a square wave, where the first tone includes a first frequency and the second tone includes a second frequency, where X may be calculated from $$\sqrt{\frac{1}{8}(Z_3^2 - Z_1^2)}.$$

is substantially equal to the magnitude of the measured impedance at the first fundamental frequency and $Z_3$ is substantially equal to the magnitude of the measured impedance at the second fundamental frequency.

Figures 9, 10:
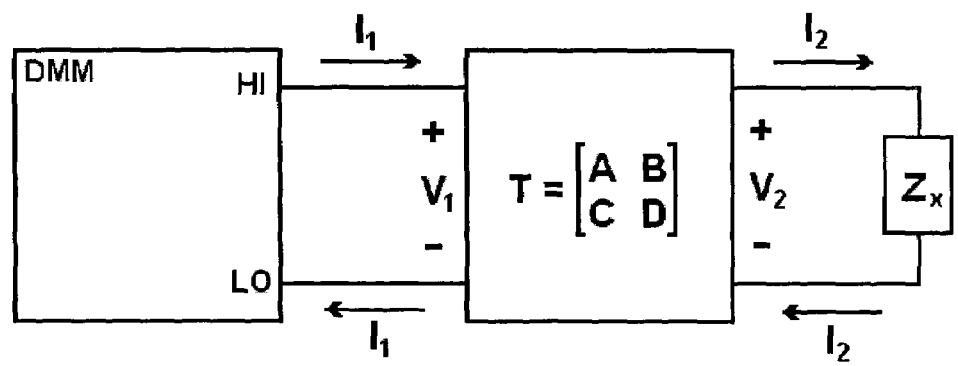
FIG. 9 is a table illustrating an exemplary set of signals applied to the electronic component for performing a measurement, according to one embodiment.
FIG. 10 is a model illustrating a relationship between the measuring device and the electronic component using a two-port network, according to one embodiment.

In some embodiments, once calibration of the measuring device is completed, the current amplitudes and front-end characteristics may be known. In some embodiments, the algorithm may be different for inductors and capacitors. In some embodiments, the algorithm may be operable to select a capacitive or inductive measurement depending on the values of impedances of the first and second tone as described above. In some embodiments, a user may request which value should be computed. Furthermore, in some embodiments, the parameters for the acquisition may vary with the frequency of the excitation signal, such as shown in FIG. 9.

Capacitance Measurements

In some embodiments, for capacitors, due to the nature of this type of electronic component and characteristics of the front-end of the measuring device, the model to calculate the measured value may be different depending on the range of the capacitor to be measured. In general, modeling small capacitors using admittance is mathematically convenient, while large capacitors are easily calculated by using impedance. Large capacitors also may be more prone to be affected by the series resistance and inductance in the setup. In some embodiments, the differentiation between the large and small capacitors may be made to calculate the two admittance components, as the formulas to get to the actual capacitance may be the same.

Small Capacitors

In some embodiments, the small capacitors model is used in the 300 pF, 1 nF, 10 nF and 100 nF ranges. In other embodiments, other ranges may be used. In some embodiments, Rs and Xs may be negligible, and they may be assumed to be zero.

$$B_{DUT} = \frac{1}{8}\left(-b + \sqrt{b^2 - 8c}\right)$$

$$G_{DUT} = -G_{PI} + \sqrt{Y_1^2 - (B_{DUT} + B_{PI})^2}$$

where $$b = 3B_{P3} - B_{PI}$$

$$c = Y_1^2 - Y_3^2 - G_{PI}^2 + G_{P3}^2 - B_{PI}^2 + B_{P3}^2$$

As described in the calibration section, $B_{Pn}$ and $G_{Pn}$ correspond to the input susceptance and input conductance respectively at the first and the third harmonic (n=1,3).

Large Capacitors

In some embodiments, the large capacitor model may be used as illustrated below.

$$X = -3\sqrt{X_S^2 - \frac{1}{8}(Z_3^2 - Z_1^2)}$$

$$R = \sqrt{Z_1^2 - (X_{SI} + X)^2} - R_{SI}$$

$$B_{DUT} = -\frac{X}{X^2 + R^2} - B_{PI}$$

$$G_{DUT} = \frac{R}{X^2 + R^2} - G_{PI}$$

In some embodiments, once the conductance and susceptance values are calculated, the computation of the parallel and series capacitance may be performed. In some embodiments, where a parallel capacitance model is used, such as described above with reference to FIG. 2C, the following equations may be used.

$$C_P = \frac{B_{DUT}}{2\pi f}$$

$$D = \frac{G_{DUT}}{|B_{DUT}|}$$

$$Q = \frac{|B_{DUT}|}{G_{DUT}}$$

In some embodiments, to compute the series model, the equations below may be used to calculate impedance:

$$X_{DUT} = -\frac{B_{DUT}}{G_{DUT}^2 + B_{DUT}^2}$$

$$R_{DUT} = \frac{G_{DUT}}{G_{DUT}^2 + B_{DUT}^2}$$

In some embodiments, the following equations may be used to calculate the equivalent series capacitance, such as described above with reference to FIG. 2A.

$$C_S = -\frac{1}{2\pi f X_{DUT}}$$

$$D = \frac{R_{DUT}}{|X_{DUT}|}$$

$$Q = \frac{|X_{DUT}|}{R_{DUT}}$$

Inductance Measurements

In some embodiments, for inductors, due to the nature of this type of electronic component and the characteristics of the front-end of the measuring device, the model to calculate the measured value may be different depending on the range of the inductor to be measured. In general, modeling small inductance using impedance is mathematically convenient, while large inductors are easily calculated by using admittance.

Small Inductors

In some embodiments where a periodic signal is generated and applied to the electronic component, for small inductors the following equations may be used.

$$X_{DUT} = \sqrt{\frac{1}{8}(Z_3^2 - Z_1^2)} - X_{SI}$$

$$R_{DUT} = \sqrt{Z_1^2 - (X_{SI} + X_1)^2} - R_{SI}$$

Large Inductors

In some embodiments where a periodic signal is generated and applied to the electronic component, for large inductors the following equations may be used.

$$B_{DUT} = \frac{9}{8}\left(-b + \sqrt{b^2 - \frac{8}{9}c}\right)$$

$$G_{DUT} = -G_P + \sqrt{Y_1^2 - (B_{DUT} + B_{PI})^2}$$

where $$b = -B_{PI} + \frac{1}{3}B_{P3}$$

$$c = Y_3^2 - Y_1^2 + G_{PI}^2 - G_{P3}^2 + B_{PI}^2 - B_{P3}^2$$

$$X_{DUT} = -\frac{B_{DUT}}{B_{DUT}^2 + G_{DUT}^2}$$

$$R_{DUT} = \frac{G_{DUT}}{B_{DUT}^2 + G_{DUT}^2}$$

In some embodiments, where a series inductance model is used, such as described above with reference to FIG. 2D, the following equations may be used.

$$L_P = \frac{X_{DUT}}{2\pi f}$$

$$D = \frac{R_{DUT}}{|X_{DUT}|}$$

$$Q = \frac{|X_{DUT}|}{R_{DUT}}$$

In some embodiments, where a parallel inductance model is used, such as described above with reference to FIG. 2B, the following equations may be used.

$$L = -\frac{1}{2\pi f B_{DUT}}$$

$$D = \frac{G_{DUT}}{|B_{DUT}|}$$

$$Q = \frac{|B_{DUT}|}{G_{DUT}}$$

Secondary Parameters

In some embodiments, the algorithms described above may used to calculate the capacitance and inductance, the values for the resistive component and ESR, dissipation factor and the quality factor. In some embodiments, the formulas to calculate the dissipation factor (D) and the quality factor (Q) are shown above, after each model for capacitance and inductance. In general, $$D = \frac{R}{|X|}$$

$$Q = \frac{|X|}{R}$$

$$D = \frac{G}{|B|}$$

$$Q = \frac{|B|}{G}$$

It is noted that the flowchart of FIG. 7 is exemplary only. Further, various steps in the flowchart of FIG. 7 may occur concurrently or in a different order than that shown, or may not be performed, as desired. Also, various additional steps may be performed as desired.

Figure 8:
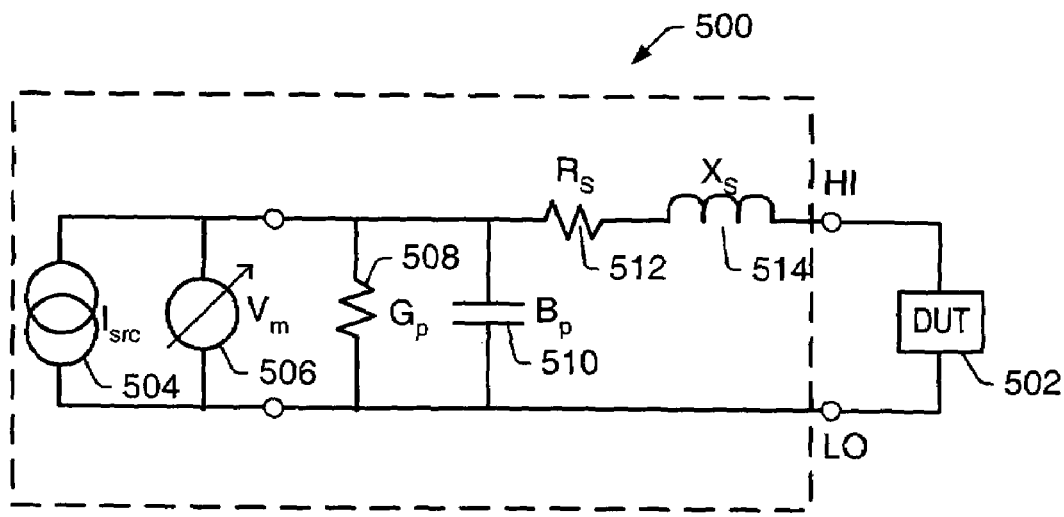
FIG. 8 illustrates a model of a measuring device operable to measure an electronic component, according to one embodiment.

FIG. 8—Model of a Measuring Device for Measuring an Electronic Component

FIG. 8 is a model of a measuring device operable to measure an electronic component, according to one embodiment. In some embodiments, the measuring device 500 may be modeled as having a current source $I_{scr}$ 504, a voltage measuring element $V_m$ 506, modeled parallel conductivity $G_p$ 508, modeled parallel susceptance $B_p$ 510, serial resistance $R_s$ 512, and serial reactance Xs 514. Models used to calculate these elements are described below with reference to FIGS. 12-18. In other embodiments, other models may be used to model the measuring device. The model of FIG. 8 may be used because front-end of the measuring device may have its own parasitic impedances that may affect the measurement. In other words, this model may be necessary in order to account for any stray admittance and residual impedance between the measuring device's inputs and the input connectors. The formulas to calculate the measuring device's impedance may take these parasitic effects into account to subtract them from the measurement.

In some embodiments, the current source may be replaced with a voltage source and the voltage measuring element may be replaced with a current measuring element.

It is noted that FIG. 8 is exemplary only, and the various elements in this Figure may have various architectures or forms, as desired. Further, various blocks in the block diagram of FIG. 8 may be included in a different order than that shown, or may not be included, as desired. Also, various additional blocks may be included as desired.

FIG. 9—Table Illustrating an Exemplary Set of Signals Applied to the Electronic Component FIG. 9 is a table illustrating an exemplary set of signals applied to the electronic component for performing a measurement, according to one embodiment. In some embodiments, the parameters for the acquisition may vary with the frequency of the excitation signal, such as shown in FIG. 9. In other words, this table contains some of the parameters that may be used by the measuring device during a measurement.

FIG. 10—Model of a Two-Port Network

FIG. 10 is a model illustrating a relationship between the measuring device and the electronic component using a two-port network, according to one embodiment.

Compensation

In some embodiments, in order to get an accurate reading, the DUT should be connected right across the input connectors. However, in many applications this is not the case, such as in automated test systems or bench-top applications. In some embodiments, test leads and fixtures may be required to reach the DUT. In some embodiments, these test leads and fixtures have their own impedance and will introduce an error in the measurement. In some embodiments, to correct for this errors, OPEN and SHORT compensation should be performed. In some embodiments, compensation is performed in addition to calibration.

In some embodiments, practical impedance measurements may require connectivity between the meter (measuring device) and the device under test (DUT), also referred to as the electronic component. Some setups may include wires, test fixtures or switches. Automatic test setups with high channel count may add more of these elements, increasing complexity and thus, more undesired errors. In some embodiments, these measurement errors can be separated in two: residual impedance and stray admittance. When one is negligible compared to the other and the DUT's, a simple offset compensation can be applied. However, when both are a significant source of error (especially on large and complex setups), the offset technique may not be very effective. Under these conditions, two-port network analysis can be used to compensate and reduce the effect of parasitics.

In some embodiments, the two-port network above can be represented using the transmission parameters T, $$\begin{pmatrix} V_1 \\ I_1 \end{pmatrix} = \begin{pmatrix} A & B \\ C & D \end{pmatrix} \begin{pmatrix} V_2 \\ I_2 \end{pmatrix} \quad (1)$$

In some embodiments, to find the parameters A, B, C and D, the OPEN and SHORT conditions may need to be applied to the circuit. For the OPEN condition, $Z_X$ may be assumed to be infinitively large and thus:

$I_2=0$

Therefore $V_1 = AV_2$ $I_1 = CV_2$

Then the admittance measured by the DMM ($Y_{OM}$) can be written as $$Y_{OM} = \frac{I_1}{V_1} = \frac{C}{A} \quad (2)$$

In some embodiments, for the SHORT condition, $Z_X$ may be assumed to be zero, and $V_2$ may be assumed to be zero, and therefore $V_1 = BI_2$ $I_1 = DI_2$ Thus, in some embodiments, the impedance measured by the DMM under a SHORT condition may be:

$$Z_{SM} = \frac{V_1}{I_1} = \frac{B}{D} \quad (3)$$

In some embodiments, since from equation (1) the measured impedance $Z_{XM}$ is given by:

$$Z_{XM} = \frac{V_1}{I_1} = \frac{AV_2 + BI_2}{CV_2 + DI_2} \quad (4)$$

By definition, the DUT's impedance may be calculated by:

$$Z_X = \frac{V_2}{I_2} \quad (5)$$

In some embodiments, from equations (4) and (5) above, $Z_X$ may be calculated by using:

$$Z_X = \frac{B - Z_{XM} D}{Z_{XM} C - A}$$

$$Z_X = \frac{\frac{B}{C} - Z_{XM}\frac{D}{C}}{Z_{XM} - \frac{A}{C}}$$

In some embodiments, A may be assumed to be equal to D for a symmetrical network and by substituting (2) and (3) in the result above. In some embodiments, for a symmetrical network, the impedance seen from both ends of the two-port network should be closely the same.

$$Z_X = \frac{\frac{Z_{SM}}{Y_{OM}} - Z_{XM}\frac{1}{Y_{OM}}}{Z_{XM} - \frac{1}{Y_{OM}}}$$

By simplifying the above, $$Z_X = \frac{Z_{SM} - Z_{XM}}{Y_{OM} Z_{XM} - 1} \quad (6)$$

And through simple algebraic manipulation it can be shown that:

$$Y_X = \frac{Y_{OM} - Y_{XM}}{Y_{XM} Z_{SM} - 1} \quad (7)$$

In some embodiments, by applying the calculations from equations (6) or (7), the error introduced by a long cable or a switching system can be reduced.

Implementation

The quantities on the previous section are complex numbers. In some embodiments, the algorithm above can be implemented with complex numeric type, following the rules below:

$Y_{OM} = G_{OM} + jB_{OM}$ $Z_{SM} = R_{SM} + jX_{SM}$ $Y_{XM} = G_{XM} + jB_{XM}$ $Z_{XM} = R_{XM} + jX_{XM}$

Where $G_{XM}$ and $B_{XM}$ are the two readings without compensation for the DUT measurements using parallel model; $R_{XM}$ and $X_{XM}$ are the two readings of the DUT without compensation returned by the board using the series model. Gom and Bom are the OPEN measurement (without compensation) using the parallel model. $R_{SM}$ and $X_{SM}$ are the SHORT measurement (without compensation) using the series model.

It is noted that FIG. 10 is exemplary only, and the various elements in this Figure may have various architectures or forms, as desired. Further, various blocks in the block diagram of FIG. 10 may be included in a different order than that shown, or may not be included, as desired. Also, various additional blocks may be included as desired.

FIGS. 11 A and 11B—Calculation Tables

FIGS. 11A and 11B are tables illustrating exemplary calculations used to obtain values of impedance and/or admittance used for compensation calculations, according to some embodiments. The tables of FIGS. 11A and 11B contain equations that can be used to calculate the compensated values of impedance/admittance. In other words, these calculations may be used to compensate for errors in the measurements. In some embodiments, OPEN and SHORT compensation may be used separately for offset compensation. The following variables may be used:

$B_X/X_X/R_X/G_X$: Compensated susceptance/reactance/resistance/conductance $B_{XM}/X_{XM}/R_{XM}/G_{XM}$: Measured susceptance/reactance/resistance/conductance $B_{OM}/G_{OM}$: Open susceptance/conductance $X_{SM}/R_{SM}$: Short reactance/resistance Once the compensated values for X and R or B and G are obtained, the same formulas from the previous sections may be used to calculate capacitance, inductance and D or Q. In some embodiments, when used at the same time, these values can correct for offset and gain errors due to a combination of significant residual impedance and stray admittance. To perform the OPEN/SHORT compensation with the series models, the following formula may be used:

$$Z_X = \frac{Z_{SM} - Z_{XM}}{Y_{OM} Z_{XM} - 1}$$

and for the parallel models:

$$Y_X = \frac{Y_{OM} - Y_{XM}}{Y_{XM} Z_{SM} - 1}$$

In some embodiments, the algorithm can be implemented with complex numbers, following the rules below:

$Y_{OM} = G_{OM} + jB_{OM}$ $Z_{SM} = R_{SM} + jX_{SM}$ $Y_{XM} = G_{XM} + jB_{XM}$ $Z_{XM} = R_{XM} + jX_{XM}$

Where $G_{XM}$ and $B_{XM}$ are the two readings without compensation for measurements using parallel model. $R_{XM}$ and $X_{XM}$ are the two readings without compensation returned by the measuring device using the series model. $G_{OM}$ and $B_{OM}$ can be obtained from the OPEN measurement (without compensation) using the parallel model. RSM and XSM can be obtained from the SHORT measurement (without compensation) using the series model.

DC Bias

In some embodiments, polarized components such as electrolytic and tantalum capacitors may be preferably tested using only positive voltages. During normal operation, the AC current source will swing negative 50% of the time, which may result as an inverse polarization on the capacitor under test. In order to prevent this situation, a DC bias may be applied such that the voltage across the part does not become negative.

Calibration

In some embodiments, the measuring device may need to be calibrated prior to measuring the electronic component. In some embodiments, the calibration process may model front-end characterization and the current values generated by a signal generator, such as the signal generator 504 described below with reference to FIG. 8. There are many models that may be used for characterizing a measuring device. In some embodiments, values stored are $G_P$, $B_P$, $R_S$, $X_S$ and the current amplitude of the fundamental and third harmonic ($I_1$ and $I_3$) of each current range and frequency. In other embodiments, other values or a subset of these variables may be used, depending on a model that is used as well as on the type of signal used.

In some embodiments, a measurement may comprise a voltage waveform acquisition. In some embodiments, only the fundamental and the third harmonic amplitudes are of interest. In other embodiments, a first tone and a second tone can be used. In other embodiments, other harmonics may be used. The tone amplitude information may be extracted in the frequency domain, after an FFT is performed on the acquired data, as described above.

In some embodiments, to find the value of the current at the different frequencies, an external resistor (for which any reactance may be neglected) may be connected between the inputs of the measuring device. Then the desired current may be applied to the resistor and a voltage signal may be acquired. In other embodiments, a desired voltage may be applied and a current signal may be acquired. In some embodiments, a first tone signal and a second tone signal may be applied. In some embodiments, a two-tone signal may be applied. In some embodiments, the amplitude of the tone of interest may be computed. To calculate the total impedance seen by the current source (required to calculate the current's value) the values of the external resistor, $R_S$, $X_S$, $G_P$ and $B_P$ may be required.

Figure 12:
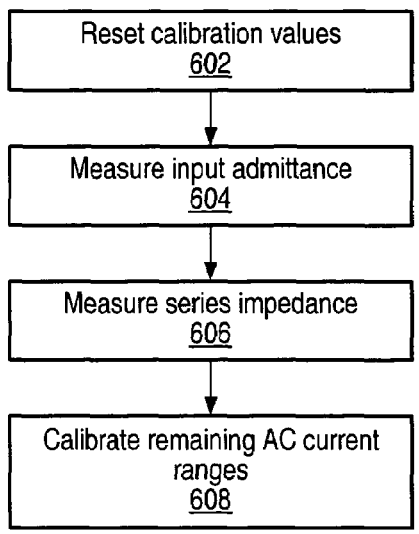
FIG. 12 is a flowchart of an exemplary method for performing a calibration of the measuring device, according to one embodiment.

FIG. 12—Method for Performing Calibration of the Measuring Device

FIG. 12 is a flowchart of an exemplary method for performing a calibration of the measuring device, according to one embodiment.

In 602, calibration values may be reset, according to one embodiment. For example, values for input admittance, series impedance, and the signal generator, such as the current, may be reset. In other embodiments that use different models to characterize the measuring device, different calibration values may be reset.

In 604, input admittance may be measured, according to one embodiment. A detailed description of measuring the input admittance is described below with reference to FIGS. 13-15.

In 606, series impedance may be measured, according to one embodiment. A detailed description of measuring the series impedance is described below with reference to FIGS. 16-18.

In 608, the remaining AC current ranges may be calibrated, according to one embodiment. At this point, not only $G_P$, $B_P$, $R_S$ and $X_S$ should be known at all the different frequencies but also the AC currents used to measure them. In some embodiments, to calibrate the rest of the currents, it may be enough to connect a resistor between the inputs. The resistor can be measured using DC to know its exact value, after the DMM has been calibrated for Ohms, and then it may be assumed the DC resistance R may be the same at different AC frequencies. In some embodiments, the tones of interest may be read from the voltage signal across the resistor and translated into current. In other embodiments, the tones of interest may be read from the current signal across the resistor and translated into voltage. These values may be stored at different frequencies and different resistors may be used for the other current amplitudes.

The formulas for the current calculation are shown below:

$$Y_{real} = G_P + \frac{R + R_S}{(R + R_S)^2 + (X + X_S)^2}$$

$$Y_{img} = B_P - \frac{X_S}{(R + R_S)^2 + (X + X_S)^2}$$

$$Y_{eq} = Y_{real} + jY_{img}$$

Where $G_P$, $B_P$, $R_S$, and $X_S$ are already known. Then the currents $I_1$ and $I_3$ at the given frequency may be calculated using:

$I_1 = |Y_{eq}| V_1$ $I_3 = |Y_{eq}| V_3$

It is noted that the flowchart of FIG. 12 is exemplary only. Further, various steps in the flowchart of FIG. 12 may occur concurrently or in a different order than that shown, or may not be performed, as desired. Also, various additional steps may be performed as desired.

Figure 13:
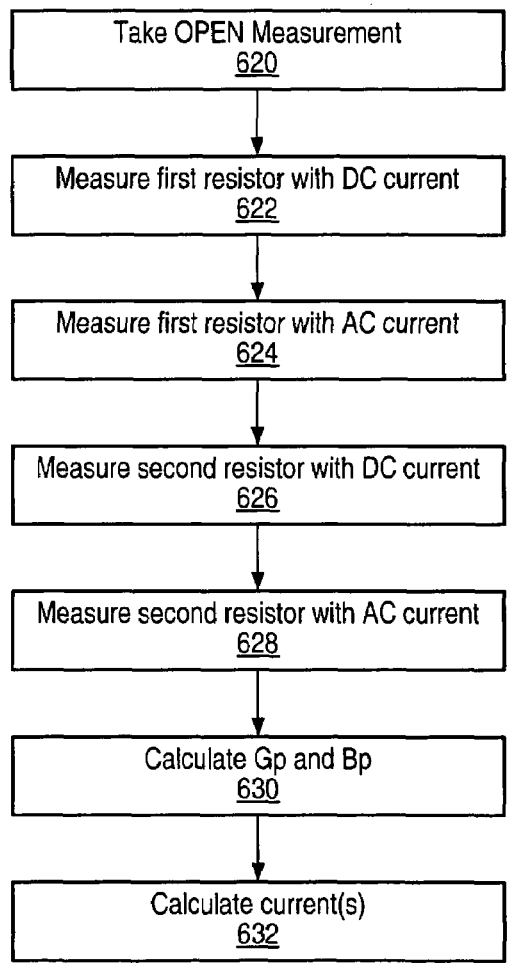
FIG. 13 is a flowchart of an exemplary method for performing an input admittance calibration, according to one embodiment.

FIGS. 13-15—Input Admittance Calibration

FIG. 13 is a flowchart of an exemplary method for performing an input admittance calibration, according to one embodiment. FIG. 14A illustrates a model used in performing an open circuit calibration, according to one embodiment. FIG. 14B illustrates a model used in performing an input admittance calibration, according to one embodiment. FIG. 15 is a table illustrating an exemplary set of signals and resistors as used by the exemplary method for performing an input admittance calibration, according to one embodiment.

In some embodiments, to find the values for $G_P$ and $B_P$, an AC current source may be required to generate an excitation signal, whose exact amplitude is also unknown. In other embodiments, a voltage source may be required. To solve this, three measurements may be performed with the same excitation signal—the voltage waveforms across two different resistors and an open circuit.

In 620, an open circuit measurement may be taken, according to one embodiment. An open circuit measurement may consist of disconnecting any components, leads or fixtures from the measuring device, setting an open circuit condition, and then turning on the excitation signal in question. The model for this measurement is shown in FIG. 14A.

In 622, a first resistor may be measured by using DC current, according to one embodiment. In the case of the resistance measurement, the value of the external resistors may be measured by the measuring device using DC current. In some embodiments, the DC current mode may be calibrated prior to this measurement. In some embodiments, $R_S$ and $X_S$ can be assumed to be zero since they have a negligible impact compared to the value of the input admittance. The model for this resistor measurement is shown in FIG. 14B.

In 624, the first resistor may be measured using AC current, according to one embodiment. In 626-628, a second resistor may be measured using DC and AC current, such as described above with reference to 622 and 624. These values may be used in the following calculations.

In 630, $G_P$ and $B_P$ may be calculated, according to some embodiments. In general, the Ohm's law may be used in the form:

$$I_N = V_N Y_N$$

Where $V_N$ is the voltage measured at the Nth tone, the $I_N$ is the current in that same tone and the $Y_N$ is the total input admittance seen by the measuring device, and may be given by:

$$Y_N = G_{PN} + jB_{PN}$$

for the OPEN circuit, and:

$$Y_N = \left(G_{PN} + \frac{1}{R}\right) + jB_{PN}$$

for a resistor. Then, solving the three equations, we may get the following formulas:

$$G_{PN} = \frac{\left(\frac{V_2^2}{R_2^2(V_0^2 - V_2^2)}\right) - \left(\frac{V_1^2}{R_1^2(V_0^2 - V_1^2)}\right)}{\left(\frac{2V_1^2}{(V_0^2 - V_1^2)R_1}\right) - \left(\frac{2V_2^2}{(V_0^2 - V_2^2)R_2}\right)},$$

and:

$$B_{PN} = \sqrt{\left(\frac{V_1^2}{R_1^2(V_0^2 - V_1^2)}\right) + G_{PN}\left(\frac{2V_1^2}{(V_0^2 - V_1^2)R_1}\right) - G_{PN}^2}$$

where $R_1$ is the first resistor, $R_2$ is the second resistor, $V_0$ corresponds to the open circuit voltage measurement, $V_1$ to the measurement of $R_1$, and $V_2$ to the measurement of $R_2$. All these may correspond to values at a single tone. The same set of equations may be used with a first and third harmonic (N=1 and N=3). This way $G_{P1}$, $G_{P3}$, $B_{P1}$ and $B_{P3}$ may be obtained. In some embodiments, the same set of equations may apply to the first tone and to the second tone. In some embodiments, the same set of equations may be used with other harmonics.

In 632, the currents may be calculated, according to some embodiments. In other embodiments, voltages may be calculated if a voltage source was used. In some embodiments, the current may be calculated using:

$$I_N = V_{ON}\sqrt{B_{PN}^2 + G_{PN}^2}$$

to obtain current for the desired tone and/or Nth harmonic.

It is noted that the flowchart of FIG. 13 is exemplary only. Further, various steps in the flowchart of FIG. 13 may occur concurrently or in a different order than that shown, or may not be performed, as desired. Also, various additional steps may be performed as desired.

It is noted that FIGS. 14A and 14B are exemplary only, and the various elements in these Figures may have various architectures or forms, as desired. Further, various elements in the block diagram of FIGS. 14A and 14B may be included in a different order than that shown, or may not be included, as desired. Also, various additional elements may be included as desired.

FIG. 15 illustrates an exemplary set of parameters, resistors, and frequencies that can be used with the above calibration method, according to some embodiments.

Figure 16:
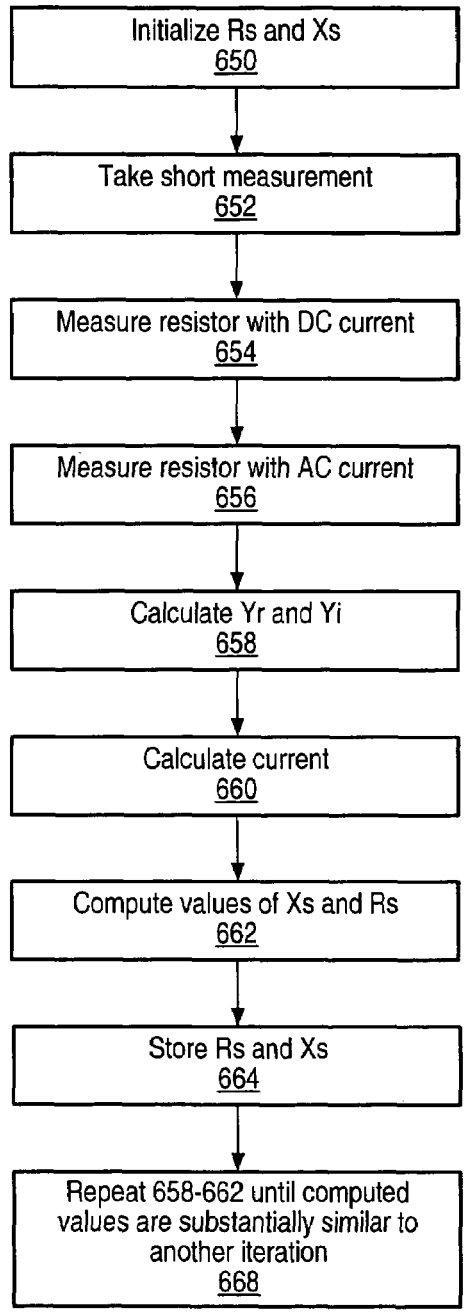
FIG. 16 is a flowchart of an exemplary method for performing a series impedance calibration, according to one embodiment.

FIGS. 16-18—Series Impedance Calibration

FIG. 16 is a flowchart of an exemplary method for performing a series impedance calibration, according to some embodiments. FIG. 17A is a model used in performing a short circuit calibration, according to some embodiments. FIG. 17B is a model used in performing a series impedance calibration, according to some embodiments. FIG. 18 is a table illustrating an exemplary set of signals and resistors as used by the exemplary method for performing a series impedance calibration, according to some embodiments.

In some embodiments, $R_S$ and $X_S$, the components of the series impedance, may be found to complete the front-end characterization. In some embodiments, the known current used to calculate $B_P$ and $G_P$ may be too small to calculate the values of $R_S$ and $X_S$. Since these are relatively small values, a higher current may be used instead. In some embodiments, the series impedance may be assumed to be the same at different frequencies, since it may be the result of the resistance in the board traces. In some embodiments, this may reduce the number of measurements to only a short circuit measurement and one resistor. In some embodiments, the main purpose of the short circuit measurement may be to find the value of $R_S$ and $X_S$; the resistor measurement may be used to find the value of the current.

In 650, values of $R_S$ and $X_S$ may be initialized to zero, according to one embodiment. In other embodiments that use different models to characterize the measuring device, different calibration values may be reset.

In 652, a short circuit measurement may be taken, according to one embodiment. The short circuit measurement may consist of shorting the inputs and measuring the total residual impedance at available test frequencies. For the short circuit measurement, the model illustrated in FIG. 17A may be used.

In 654, a resistor may be measured using DC current, according to one embodiment. In some embodiments, the resistor measurement may be taken and the current can be calculated neglecting $R_S$ and $X_S$. In some embodiments, although this may introduce some error in the current measurement, it may be a good first estimate of the real current value. In some embodiments, the $R_S$ and $X_S$ values may be approximated in order to include them in the current calculation again. In some embodiments, iterating may be used to reduce the approximation error. The model for this resistor measurement is illustrated in FIG. 17B.

In 656, a resistor may be measured using AC current, according to one embodiment, in a similar manner to one described above.

In 658, $Y_R$ and $Y_I$ may be calculated, according to one embodiment. These may be the real and the imaginary portions of the total admittance of the front-end of the measuring device. In some embodiments, these values may be calculated using the formulas $$Y_{RN} = G_{PN} + \frac{R_N + R_{SN}}{(R_N + R_{SN})^2 + X_{SN}^2}$$

$$Y_{IN} = B_{PN} - \frac{X_{SN}}{(R_N + R_{SN})^2 + X_{SN}^2}$$

to obtain values for the desired tone and/or Nth harmonic.

In 660, the current may be calculated, according to one embodiment. In some embodiments, the following equation may be used: $I_N = V_{RN}\sqrt{Y_{RN}^2 + Y_{IN}^2}$, where $V_R$ is the voltage from the resistor measurement applying the current I; $Y_R$ and $Y_I$ are the real and imaginary components of the total input admittance in the front-end respectively.

In 662, values of $X_S$ and $R_S$ may be calculated. In some embodiments, $R_S$ and $X_S$ may be calculated with the formulas:

$$R_{SN} = \sqrt{\frac{1}{8}\left(9\frac{V_1^2}{I_1^2} - \frac{V_3^2}{I_3^2}\right)}$$

$$X_{SN} = N\sqrt{\frac{1}{8}\left(\frac{V_3^2}{I_3^2} - \frac{V_1^2}{I_1^2}\right)}$$

In 664, values of $X_S$ and $R_S$ may be stored, according to one embodiment. These values may be stored for the desired tone and/or Nth harmonic. In 668, the steps 658-662 may be repeated until the difference in the computed values for current and/or $R_S$ and $X_S$ in consecutive iterations is no longer significant.

It is noted that the flowchart of FIG. 16 is exemplary only. Further, various steps in the flowchart of FIG. 16 may occur concurrently or in a different order than that shown, or may not be performed, as desired. Also, various additional steps may be performed as desired.

It is noted that FIGS. 17A and 17B are exemplary only, and the various elements in these Figures may have various architectures or forms, as desired. Further, various elements in the block diagram of FIGS. 17A and 17B may be included in a different order than that shown, or may not be included, as desired. Also, various additional elements may be included as desired.

FIG. 18 illustrates an exemplary set of parameters, resistors, and frequencies that can be used with the above calibration method, according to some embodiments.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for determining a value of an electronic component, the method comprising:
    applying a source signal to the electronic component, wherein said applying the source signal comprises applying one of a current signal or a voltage signal, wherein the source signal comprises first and second tones, wherein the first and second tones differ in frequency, wherein the source signal further comprises magnitude and phase;
    measuring a response signal from the electronic component to generate a measured response signal, wherein said measuring the response signal comprises measuring one of a current signal or a voltage signal generated across the electronic component in response to said applying the source signal, wherein the measured response signal comprises another first and second tones, wherein the measured response signal further comprises magnitude and phase, wherein said measuring the response signal is not synchronized with said applying the source signal;
    performing signal processing on the measured response signal to generate a frequency domain signal, wherein the phase of the measured response signal is not used in said performing signal processing;
    calculating the value of the electronic component using the frequency domain signal by using a relationship between the first tone of the measured response signal and the second tone of the measured response signal, wherein the phase of the measured response signal is not used in said calculating; and
    storing the value of the electronic component.

2. The method of claim 1,
    wherein said performing signal processing on the measured response signal comprises applying a signal processing technique on the measured response signal, wherein said applying the signal processing technique operates to obtain a magnitude of a phasor value of the first tone of the measured response signal and a magnitude of a phasor value of the second tone of the measured response signal, wherein the first tone of the response signal is at a first frequency and wherein the second tone of the response signal is at a second frequency.

3. The method of claim 1, wherein said signal processing technique comprises one or more of:
Tone extraction;
Peak detection;
Fast Fourier Transform;
Discrete Fourier Transform;
Power Spectrum Analysis; or
any other type of a signal processing technique that operates to extract magnitudes of interest of a signal.

4. The method of claim 1,
wherein said measuring the response signal comprises measuring the magnitude associated with the response signal; and
wherein said calculating the value of the electronic component comprises only using magnitude associated with the frequency domain signal.

5. The method of claim 1,
wherein the first tone of the measured response signal is at a first frequency and wherein the second tone of the measured response signal is at a second frequency; and
wherein the frequency domain signal at the frequency of the first tone and at the frequency of the second tone can be used to calculate a magnitude of impedance of the electronic component at the frequency of the first tone of the measured response signal and a magnitude of impedance of the electronic component at the frequency of the second tone of the measured response signal.

6. The method of claim 5,
wherein the electronic component is a capacitor; and
wherein the value of the electronic component comprises a capacitance substantially equal to $$\frac{1}{X\omega},$$

wherein 107 is equal to $2\pi f_0$, wherein $f_0$ is substantially equal to the frequency of the measured response signal, the method further comprising:
calculating X based on a relationship between the magnitude of the impedance of the electronic component at the frequency of the first tone of the measured response signal and the magnitude of the impedance of the electronic component at the frequency of the second tone of the measured response signal.

7. The method of claim 6,
wherein said calculating X comprises calculating $$\sqrt{\frac{9}{8}(Z_1^2 - Z_3^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

8. The method of claim 6,
wherein the electronic component is a capacitor if the magnitude of the impedance of the electronic component at the first frequency is greater than the magnitude of the impedance of the electronic component at the second frequency.

9. The method of claim 5,
wherein the electronic component is an inductor; and
wherein the value of the electronic component comprises inductance substantially equal to $$\frac{X}{\omega},$$

wherein $\omega$ is equal to $2\pi f_0$, wherein $f_0$ is substantially equal to the frequency of the measured response signal, the method further comprising:
calculating X based on a relationship between the magnitude of the impedance of the electronic component at the frequency of the first tone of the measured response signal and the magnitude of the impedance of the electronic component at the frequency of the second tone of the measured response signal.

10. The method of claim 9,
wherein said calculating X comprises calculating $$\sqrt{\frac{1}{8}(Z_3^2 - Z_1^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

11. The method of claim 9,
wherein the electronic component is an inductor if the magnitude of the impedance of the electronic component at the first frequency is smaller than the magnitude of the impedance of the electronic component at the second frequency.

12. The method of claim 1, wherein the source signal comprises one or more of:
two separate signals, wherein the two separate signals comprise the first and second tones respectively;
a two-tone signal;
a square wave signal;
a triangle wave signal;
a sinusoidal wave signal; or
any other periodic signal that comprises two or more frequencies.

13. The method of claim 1, further comprising:
calculating one or more of a dissipation factor or a quality factor for the electronic component.

14. The method of claim 13,
wherein said calculating the dissipation factor comprises calculating one or more of:

$$\frac{R}{|X|},$$

wherein R is a calculated resistance of the electronic component and X is a calculated reactance of the electronic component; or $$\frac{G}{|B|},$$

wherein G is a calculated conductivity of the electronic component and B is a calculated susceptance of the electronic component.

15. The method of claim 13,
wherein said calculating the quality factor comprises calculating one or more of:

$$\frac{|X|}{R},$$

wherein R is a calculated resistance of the electronic component and X is a calculated reactance of the electronic component; or $$\frac{|B|}{G},$$

wherein G is a calculated conductivity of the electronic component and B is a calculated susceptance of the electronic component.

16. The method of claim 1, further comprising:
performing compensation measurements for one or more of:
  at least one test lead connecting to the electronic component; or
  any fixture used for the electronic component.

17. The method of claim 1, further comprising:
performing DC bias compensation for measurements of the electronic components such that the electronic component is not inversely polarized.

18. The method of claim 1, further comprising:
performing one or more calibration measurements prior to said applying the source signal to the electronic component, wherein the each of the one or more calibration measurements operates to characterize front end of a measuring device used in said calculating the value of the electronic component.

19. The method of claim 18,
wherein said performing one or more calibration measurements comprises one or more of:
  using an external resistor between inputs of the measuring device;
  applying a desired current to the external resistor;
  acquiring a voltage waveform in response to said applying the desired current; or
  calculating total impedance seen by a current source of the measuring device.

20. The method of claim 18,
wherein said performing one or more calibration measurements comprises calculating the total impedance seen by the current source; and
wherein said characterizing the front end of the measuring device comprises measuring one or more of an input admittance or series impedance.

21. The method of claim 20,
wherein said measuring the input admittance comprises one or more of measuring voltage across a external first resistor, measuring voltage across a second external resistor, or measuring voltage across an open circuit.

22. The method of claim 20,
wherein said measuring the input admittance comprises performing one or more of the following at one or more frequencies:
  performing an open circuit measurement;
  performing a measurement across a first external resistor using DC current;
  performing a measurement across the first external resistor using AC current;
  performing a measurement across a second external resistor using DC current;
  performing a measurement across the second external resistor using AC current;
  calculating one or more of conductivity and susceptance for the one or more frequencies; or
  calculating currents at the one or more frequencies.

23. The method of claim 22,
wherein said performing the open circuit measurement comprises performing the open circuit measurement with one or more of components, leads, or fixtures disconnected from the measuring device.

24. The method of claim 20,
wherein said measuring the series impedance comprises one or more of measuring voltage across a first external resistor and/or measuring voltage across a short circuit.

25. The method of claim 24,
wherein said measuring the series impedance comprises performing one or more of the following at one or more frequencies:
  performing a short circuit measurement;
  performing a measurement across a first external resistor using DC current;
  performing a measurement across the first external resistor using AC current;
  calculating total admittance of the front end of the measuring device; or
  calculating a value for a generated current.

26. The method of claim 18,
wherein said characterizing the front end of the measuring device operates to calibrate values used to model the measuring device.

27. A method to determine a value of an electronic component, the method comprising:
  applying a periodic signal to the electronic component, wherein said applying the periodic signal comprises applying one of a current signal or a voltage signal, wherein the periodic signal comprises signals at two or more frequencies;
  acquiring a response signal from the electronic component, wherein said acquiring the response signal comprises measuring one of a current signal or a voltage signal generated across the electronic component in response to said applying the periodic signal, wherein the response signal comprises signals at two or more frequencies, wherein the acquisition of the response signal is not trigger by the applied periodic signal resulting in asynchronous acquisition;
  performing signal processing on the response signal to generate a frequency domain signal;
  calculating the value of the electronic component using the frequency domain signal by using a relationship between a magnitude of the response signal at a first frequency and a magnitude of the response signal at a second frequency; and
  storing the value of the electronic component.

28. The method of claim 27,
wherein the response signal at the first frequency comprises a first harmonic of the response signal; and
wherein the response signal at the second frequency comprises a third harmonic of the response signal.

29. The method of claim 27,
wherein the frequency domain signal at the first frequency and at the second frequency can be used to calculate a magnitude of impedance of the electronic component at the first frequency of the response signal and a magnitude of impedance of the electronic component at the second frequency of the response signal.

30. The method of claim 29,
wherein the electronic component is a capacitor; and
wherein the value of the electronic component comprises a capacitance substantially equal to $$\frac{1}{X\omega},$$

wherein $\omega$ is equal to $2\pi f_0$, wherein $f_0$ is substantially equal to the frequency of the response signal, the method further comprising:
calculating X based on a relationship between the magnitude of the impedance of the electronic component at the first frequency of the response signal and the magnitude of the impedance of the electronic component at the second frequency of the response signal.

31. The method of claim 30,
wherein said calculating X comprises calculating $$\sqrt{\frac{9}{8}(Z_1^2 - Z_3^2)},$$

wherein $Z_1$ is the magnitude of the impedance of the electronic component at the first frequency of the response signal and $Z_3$ is the magnitude of the impedance of the electronic component at the second frequency of the response signal.

32. The method of claim 30,
wherein the electronic component is a capacitor if the magnitude of the impedance of the electronic component at the first frequency of the response signal is greater than the magnitude of the impedance of the electronic component at the second frequency of the response signal.

33. The method of claim 29,
wherein the electronic component is an inductor; and
wherein the value of the electronic component comprises inductance substantially equal to $$\frac{X}{\omega},$$

wherein $\omega$ is equal to $2\pi f_0$, wherein $\omega$ is substantially equal to the frequency of the response signal, the method further comprising:
calculating X based on a relationship between the magnitude of the impedance of the electronic component at the first frequency of the response signal and the magnitude of the impedance of the electronic component at the second frequency of the response signal.

34. The method of claim 33,
wherein said calculating X comprises calculating $$\sqrt{\frac{1}{8}(Z_3^2 - Z_1^2)},$$

wherein $Z_1$ is the magnitude of the impedance of the electronic component at the first frequency of the response signal and $Z_3$ is the magnitude of the impedance of the electronic component at the second frequency of the response signal.

35. The method of claim 33,
wherein the electronic component is an inductor if the magnitude of the impedance of the electronic component at the first frequency of the response signal is smaller than the magnitude of the impedance of the electronic component at the second frequency of the response signal.

36. The method of claim 27, wherein the periodic signal comprises one or more of:
two separate signals, wherein the two separate signals comprise the first and second tones respectively;
a two-tone signal;
a square wave signal;
a triangle wave signal;
a sinusoidal wave signal; or
any other periodic signal that comprises two or more frequencies.

37. The method of claim 27, further comprising:
performing calibration measurement prior to said applying the periodic signal to the electronic component, wherein the calibration measurement operates to characterize front end of a measuring device used in said measuring the value of the electronic component.

38. A system for determining a value of an electronic component, the system comprising:
a signal generator operable to apply a source signal to the electronic component, wherein said applying the source signal comprises applying a current signal or a voltage signal, wherein the source signal comprises first and second tones, wherein the first and second tones differ in frequency;
a measuring device operable to measure a response signal from the electronic component, wherein said measuring the response signal comprises measuring a current or a voltage generated across the electronic component in response to said applying the source signal, wherein the response signal comprises another first and second tones, wherein the response signal further comprises magnitude and phase, wherein the measuring device is not synchronized with the signal generator;
a signal processing device operable to apply signal processing to the response signal to generate a frequency domain signal, wherein the phase of the response signal is not used in said applying signal processing; and
a calculating device operable to calculate the value of the electronic component using the frequency domain signal by using a relationship between the first tone of the response signal and the second tone of the response signal, wherein the phase of the response signal is not used in said calculating, wherein the value of the electronic component is stored;
wherein the frequency domain signal at the first tone and at the second tone can be used to calculate a magnitude of impedance of the electronic component at the frequency of the first tone of the response signal and a magnitude of impedance of the electronic component at the frequency of the second tone of the response signal.

39. The system of claim 38,
wherein the signal generator device and the measuring device are comprised on a single device.

40. The system of claim 38,
wherein the electronic component is a capacitor; and
wherein the value of the electronic component comprises a capacitance substantially equal to $$\frac{1}{X\omega},$$

wherein ω is equal to $2\pi f_0$, wherein $f_0$ is substantially equal to the frequency of the response signal, the method further comprising:
calculating X based on a relationship between the magnitude of the impedance of the electronic component at the frequency of the first tone of the response signal and the magnitude of the impedance of the electronic component at the frequency of the second tone of the response signal.

41. The system of claim 40,
wherein said calculating X comprises calculating $$\sqrt{\frac{9}{8}(Z_1^2 - Z_3^2)},$$

wherein $Z_1$ is the magnitude of the impedance of the electronic component at the frequency of the first tone of the response signal and $Z_3$ is the magnitude of the impedance of the electronic component at the frequency of the second tone of the response signal.

42. The system of claim 38,
wherein the electronic component is a capacitor if the magnitude of the impedance of the electronic component at the first frequency of the response signal is greater than the magnitude of the impedance of the electronic component at the second frequency of the response signal.

43. The system of claim 38,
wherein the electronic component is an inductor; and
wherein the value of the electronic component comprises inductance substantially equal to $$\frac{X}{\omega},$$

wherein ω is equal to $2\pi f_0$, wherein $f_0$ is substantially equal to the frequency of the response signal, the method further comprising:
calculating X based on a relationship between the magnitude of the impedance of the electronic component at the frequency of the first tone of the response signal and the magnitude of the impedance of the electronic component at the frequency of the second tone of the response signal.

44. The system of claim 43,
wherein said calculating X comprises calculating $$\sqrt{\frac{1}{8}(Z_3^2 - Z_1^2)},$$

wherein $Z_1$ is the magnitude of the impedance of the electronic component at the frequency of the first tone of the response signal and $Z_3$ is the magnitude of the impedance of the electronic component at the frequency of the second tone of the response signal.

45. The system of claim 43,
wherein the electronic component is an inductor if the magnitude of the impedance of the electronic component at the first frequency of the response signal is smaller than the magnitude of the impedance of the electronic component at the second frequency of the response signal.

46. The system of claim 38, wherein a calibration measurement is performed prior to said applying the source signal to the electronic component, wherein the calibration measurement operates to characterize a front end of the measuring device used in said measuring the value of the electronic component.

47. A method for determining a value of an electronic component, the method comprising:
applying a source signal to the electronic component, wherein said applying the source signal comprises applying one of a current signal or a voltage signal, wherein the source signal comprises first and second tones, wherein the first and second tones differ in frequency, wherein the source signal further comprises magnitude and phase;
measuring a response signal from the electronic component to generate a measured response signal, wherein said measuring the response signal comprises measuring one of a current signal or a voltage signal generated across the electronic component in response to said applying the source signal, wherein the measured response signal comprises another first and second tones, wherein the measured response signal further comprises magnitude and phase, wherein the source signal is out-of-phase with the response signal;
performing signal processing on the measured response signal to generate a frequency domain signal, wherein the phase of the measured response signal is not used in said performing signal processing;
calculating the value of the electronic component using the frequency domain signal by using a relationship between the first tone of the measured response signal and the second tone of the measured response signal, wherein the phase of the measured response signal is not used in said calculating; and
storing the value of the electronic component.

48. The method of claim 47,
wherein the first tone of the measured response signal is at a first frequency and wherein the second tone of the measured response signal is at a second frequency; and
wherein the frequency domain signal at the frequency of the first tone and at the frequency of the second tone can be used to calculate a magnitude of impedance of the electronic component at the frequency of the first tone of the measured response signal and a magnitude of impedance of the electronic component at the frequency of the second tone of the measured response signal.

49. The method of claim 48,
wherein the electronic component is a capacitor; and
wherein the value of the electronic component comprises a capacitance substantially equal to $$\frac{1}{X\omega},$$

wherein ω is equal to $2\pi f_0$, wherein $f_0$ is substantially equal to the frequency of the measured response signal, the method further comprising:

calculating X based on a relationship between the magnitude of the impedance of the electronic component at the frequency of the first tone of the measured response signal and the magnitude of the impedance of the electronic component at the frequency of the second tone of the measured response signal.

50. The method of claim 49, wherein said calculating X comprises calculating $$\sqrt{\frac{9}{8}(Z_1^2 - Z_3^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

51. The method of claim 48,
wherein the electronic component is an inductor; and
wherein the value of the electronic component comprises inductance substantially equal to $$\frac{X}{\omega},$$

wherein $\omega$ is equal to $2\pi f_0$, wherein $f_0$ is substantially equal to the frequency of the measured response signal, the method further comprising:
calculating X based on a relationship between the magnitude of the impedance of the electronic component at the frequency of the first tone of the measured response signal and the magnitude of the impedance of the electronic component at the frequency of the second tone of the measured response signal.

52. The method of claim 51,
wherein said calculating X comprises calculating $$\sqrt{\frac{1}{8}(Z_3^2 - Z_1^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

53. A method for determining a value of an electronic component, the method comprising:
applying a source signal to the electronic component, wherein said applying the source signal comprises applying one of a current signal or a voltage signal, wherein the source signal comprises first and second tones, wherein the first and second tones differ in frequency, wherein the source signal further comprises magnitude and phase;
measuring a response signal from the electronic component to generate a measured response signal, wherein said measuring the response signal comprises measuring one of a current signal or a voltage signal generated across the electronic component in response to said applying the source signal, wherein the measured response signal comprises another first and second tones, wherein the measured response signal further comprises magnitude and phase, wherein said measuring is started when the source signal is at an unknown phase;
performing signal processing on the measured response signal to generate a frequency domain signal, wherein the phase of the measured response signal is not used in said performing signal processing;
calculating the value of the electronic component using the frequency domain signal by using a relationship between the first tone of the measured response signal and the second tone of the measured response signal, wherein the phase of the measured response signal is not used in said calculating; and
storing the value of the electronic component.

54. The method of claim 53,
wherein the first tone of the measured response signal is at a first frequency and wherein the second tone of the measured response signal is at a second frequency; and
wherein the frequency domain signal at the frequency of the first tone and at the frequency of the second tone can be used to calculate a magnitude of impedance of the electronic component at the frequency of the first tone of the measured response signal and a magnitude of impedance of the electronic component at the frequency of the second tone of the measured response signal.

55. The method of claim 54,
wherein the electronic component is a capacitor; and
wherein the value of the electronic component comprises a capacitance substantially equal to $$\frac{1}{X\omega},$$

wherein $\omega$ is equal to $2\pi f_0$, wherein $f_0$ is substantially equal to the frequency of the measured response signal, the method further comprising:
calculating X based on a relationship between the magnitude of the impedance of the electronic component at the frequency of the first tone of the measured response signal and the magnitude of the impedance of the electronic component at the frequency of the second tone of the measured response signal.

56. The method of claim 55, wherein said calculating X comprises calculating $$\sqrt{\frac{9}{8}(Z_1^2 - Z_3^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

57. The method of claim 54,
wherein the electronic component is an inductor; and
wherein the value of the electronic component comprises inductance substantially equal to $$\frac{X}{\omega},$$

wherein $\omega$ is equal to $2\pi f_0$, wherein $f_0$ is substantially equal to the frequency of the measured response signal, the method further comprising:

calculating X based on a relationship between the magnitude of the impedance of the electronic component at the frequency of the first tone of the measured response signal and the magnitude of the impedance of the electronic component at the frequency of the second tone of the measured response signal.

58. The method of claim 57,
  wherein said calculating X comprises calculating $$\sqrt{\frac{1}{8}(Z_3^2 - Z_1^2)},$$

wherein $Z_1$ is the magnitude of the impedance of the electronic component at the frequency of the first tone of the measured response signal and $Z_3$ is the magnitude of the impedance of the electronic component at the frequency of the second tone of the measured response signal.

* * * * *

UNITED STATES PATENT AND TRADEMARK OFFICE
CERTIFICATE OF CORRECTION

PATENT NO. : 7,383,140 B2  Page 1 of 1
APPLICATION NO. : 11/049028
DATED : June 3, 2008
INVENTOR(S) : Paz et al.

It is certified that error appears in the above-identified patent and that said Letters Patent is hereby corrected as shown below:

In the Claims:

Column 25
Line 39, please delete "107" and substitute -- $\omega$ --.

Column 26
Line 10, please delete "27$\pi$f$_0$" and substitute -- 2$\pi$f$_0$ --.

Column 28
Line 52, please delete "trigger" and substitute -- triggered --.

Signed and Sealed this

Twenty-ninth Day of July, 2008

JON W. DUDAS
*Director of the United States Patent and Trademark Office*